(12) United States Patent
Fang et al.

(10) Patent No.: US 11,289,537 B2
(45) Date of Patent: Mar. 29, 2022

(54) TRANSFER SUBSTRATE, METHOD OF FABRICATING MICRO LIGHT EMITTING DIODE DISPLAY SUBSTRATE, AND MICRO LIGHT EMITTING DIODE DISPLAY SUBSTRATE

(71) Applicants: BEIJING BOE OPTOELECTRONICS TECHNOLOGY CO., LTD., Beijing (CN); BOE Technology Group Co., Ltd., Beijing (CN)

(72) Inventors: Liyu Fang, Beijing (CN); Lingyu Sun, Beijing (CN); Jingjun Du, Beijing (CN); Fei Liang, Beijing (CN); Tingxiu Hou, Beijing (CN)

(73) Assignees: BEIJING BOE OPTOELECTRONICS TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 330 days.

(21) Appl. No.: 16/483,734

(22) PCT Filed: Feb. 12, 2019

(86) PCT No.: PCT/CN2019/074840
§ 371 (c)(1),
(2) Date: Aug. 5, 2019

(87) PCT Pub. No.: WO2020/062750
PCT Pub. Date: Apr. 2, 2020

(65) Prior Publication Data
US 2021/0335634 A1    Oct. 28, 2021

(30) Foreign Application Priority Data

Sep. 27, 2018  (CN) .......................... 201811129672.7

(51) Int. Cl.
*H01L 27/20* (2006.01)
*H01L 21/67* (2006.01)
(Continued)

(52) U.S. Cl.
CPC ........ *H01L 27/20* (2013.01); *H01L 21/67144* (2013.01); *H01L 25/167* (2013.01); *H01L 41/0986* (2013.01)

(58) Field of Classification Search
CPC . H01L 21/67144; H01L 25/167; H01L 27/20; H01L 41/0986; H01L 21/683;
(Continued)

(56) References Cited

U.S. PATENT DOCUMENTS

2004/0134772 A1 *  7/2004  Cohen .................. H01P 11/005
                                                     204/198
2018/0351030 A1 * 12/2018  Goward ................. H01L 24/95
(Continued)

FOREIGN PATENT DOCUMENTS

CN    108257905 A    7/2018
CN    108281368 A    7/2018
CN    108389825 A    8/2018

OTHER PUBLICATIONS

International Search Report & Written Opinion dated May 29, 2019, regarding PCT/CN2019/074840.
(Continued)

*Primary Examiner* — Eduardo A Rodela
(74) *Attorney, Agent, or Firm* — Intellectual Valley Law, P.C.

(57) ABSTRACT

A transfer substrate for transferring an array of a plurality of micro light emitting diodes (micro LEDs) onto a target substrate. The transfer substrate includes a base substrate and an array of a plurality of electroactive actuators. A respective one of the plurality of electroactive actuators
(Continued)

includes a ring-shaped frame structure substantially surrounding a central opening, the ring-shaped frame structure made of an electroactive material. The ring-shaped frame structure is configured to undergo a reversible deformation between a first state and a second state upon a change in an electric field applied on the ring-shaped frame structure. A distance between two positions on an inner wall of the ring-shaped frame structure and across the central opening having a first value in the first state and a second value in the second state. The first value is greater than the second value.

20 Claims, 14 Drawing Sheets

(51) Int. Cl.
    *H01L 25/16*     (2006.01)
    *H01L 41/09*     (2006.01)

(58) Field of Classification Search
    CPC ............ H01L 21/687; H01L 21/68721; H01L 21/68728; H01L 21/68735; H01L 21/6875; H01L 21/68771; H01L 21/68778; H01L 33/005; H01L 41/0825; H01L 41/0836; H01L 41/09; H01L 41/0906; H01L 41/0913; H01L 41/092; H01L 41/311; H01L 41/47; B81B 3/0018; B81B 3/0021; B81B 3/0054; B81B 3/0059; B81B 3/0062; B81B 3/0067; B81B 7/008; B81C 3/002; B81C 3/004; B65G 49/05; B65G 49/07

See application file for complete search history.

(56) References Cited

U.S. PATENT DOCUMENTS

| | | | |
|---|---|---|---|
| 2019/0139794 A1* | 5/2019 | Saketi | H01L 21/67144 |
| 2019/0154551 A1* | 5/2019 | Richter | G01N 33/0009 |
| 2019/0244846 A1 | 8/2019 | Hsieh et al. | |

OTHER PUBLICATIONS

First Office Action in the Chinese Patent Application No. 201811129672.7, dated Sep. 19, 2019; English translation attached.

* cited by examiner

```
┌─────────────────────────────────────────────┐
│ Forming an electroactive material layer on a base │
│                    substrate                │
└─────────────────────────────────────────────┘
                      │
                      ▼
┌─────────────────────────────────────────────┐
│ Forming an array of a plurality of electroactive │
│       actuators on the base substrate       │
└─────────────────────────────────────────────┘
```

FIG. 11

```
┌─────────────────────────────────────────────────┐
│ Forming a first controlling sub-electrode on a first side │
│ of a ring-shaped frame structure and a second   │
│ controlling sub-electrode on a second side of a ring- │
│ shaped frame structure using a second           │
│           photolithography process              │
└─────────────────────────────────────────────────┘
                        │
                        ▼
┌─────────────────────────────────────────────────┐
│ Forming an electroactive material layer on a base │
│                    substrate                    │
└─────────────────────────────────────────────────┘
                        │
                        ▼
┌─────────────────────────────────────────────────┐
│ Forming an array of a plurality of electroactive │
│        actuators on the base substrate          │
└─────────────────────────────────────────────────┘
```

TRANSFER SUBSTRATE, METHOD OF FABRICATING MICRO LIGHT EMITTING DIODE DISPLAY SUBSTRATE, AND MICRO LIGHT EMITTING DIODE DISPLAY SUBSTRATE

CROSS-REFERENCE TO RELATED APPLICATION

This application is a national stage application under 35 U.S.C. § 371 of International Application No. PCT/CN2019/074840, filed Feb. 12, 2019, which claims priority to Chinese Patent Application No. 201811129672.7, filed Sep. 27, 2018, the contents of which are incorporated by reference in the entirety.

TECHNICAL FIELD

The present invention relates to display technology, more particularly, to a transfer substrate, a method of fabricating a micro light emitting diode (micro LED) display substrate, and a micro light emitting diode (micro LED) display substrate.

BACKGROUND

The micro light emitting diodes (micro LEDs) is a new display technology. The micro LEDs not only has the same characteristics the inorganic LEDs has, such as high efficiency, high brightness, high reliability, and fast response, but also has the characteristics the inorganic LEDs doesn't have, for example, the micro LEDs can self-illuminate without using a backlight. Comparing with the inorganic LEDs, the micro LEDs is more energy saving and thinner. It also has simpler structural and smaller size.

SUMMARY

In one aspect, the present disclosure provides a transfer substrate for transferring an array of a plurality of micro light emitting diodes (micro LEDs) onto a target substrate, comprising a base substrate; and an array of a plurality of electroactive actuators; wherein a respective one of the plurality of electroactive actuators comprises a ring-shaped frame structure substantially surrounding a central opening, the ring-shaped frame structure made of an electroactive material; and the ring-shaped frame structure is configured to undergo a reversible deformation between a first state and a second state upon a change in an electric field applied on the ring-shaped frame structure, a distance between two positions on an inner wall of the ring-shaped frame structure and across the central opening having a first value in the first state and a second value in the second state, the first value being greater than the second value.

Optionally, the array of the plurality of electroactive actuators has a pattern substantially the same as a pattern of the array of a plurality of micro LEDs; the central opening in the first state has a size greater than a size of a respective one of the plurality of micro LEDs, and the respective one of the plurality of micro LEDs being freely removable from the central opening in the first state; and the central opening in the second state has a size equal to or less than the size of the respective one of the plurality of micro LEDs, and the ring-shaped frame structure is configured to secure the respective one of the plurality of micro LEDs therein.

Optionally, the ring-shaped frame structure has a closed ring shape.

Optionally, a respective one of the plurality of electroactive actuators further comprises a controlling electrode.

Optionally, the controlling electrode comprises a first controlling sub-electrode on a first side of the ring-shaped frame structure of the respective one of the plurality of electroactive actuators, and a second controlling sub-electrode on a second side of the ring-shaped frame structure of the respective one of the plurality of electroactive actuators.

Optionally, a same row of the array of the plurality of electroactive actuators shares a same integral first controlling sub-electrode along a row direction of the army of the plurality of electroactive actuators; and the same row of the array of the plurality of electroactive actuators shares a same integral second controlling sub-electrode along the row direction of the array of the plurality of electroactive actuators.

Optionally, the controlling electrode and the ring-shaped frame structure are on a same layer; and the first controlling sub-electrode is on a side of a wall of the ring-shaped frame structure away from a center of the central opening; the second controlling sub-electrode is on a side of the wall of the ring-shaped frame structure away from the center of the central opening; and the first side is substantially opposite to the second side.

Optionally, the ring-shaped frame structure is on aside of the controlling electrode away from the base substrate; and an orthographic projection of the ring-shaped frame structure on the base substrate at least partially overlaps with an orthographic projection of the controlling electrode on the base substrate.

Optionally, the electroactive material comprises a material selected from a group consisting of zinc oxide, lead magnesium niobate, lead magnesium niobate-lead titanate, lead lanthanum zirconate titanate, and lead barium zirconate titanate.

Optionally, a height of the ring-shaped frame structure along a direction perpendicular to a main surface of the base substrate is equal to or greater than one half of a height of a respective one of the plurality of micro LEDs to be transferred.

Optionally, a maximum width of the central opening between two positions on an inner wall of the ring-shaped frame structure is in a range of approximately 1 μm to approximately 100 μm; and a thickness of a wall of the ring-shaped frame structure is in a range of approximately 1 μm to approximately 100 μm.

Optionally, an electric field is not applied to the ring-shaped frame structure in the first state; upon application of an electric field on the ring-shaped frame structure, a wall of the ring-shaped frame structure is configured to expand toward a center of the central opening to reduce the distance between two positions on the inner wall of the ring-shaped frame structure from the first value to the second value; and upon removal of the electric field on the ring-shaped frame structure, the wall of the ring-shaped frame structure is configured to withdraw away from the center of the central opening to increase the distance between two positions on an inner wall of the ring-shaped frame structure from the second value to the first value.

In one aspect, the present disclosure provides a method of fabricating a micro light emitting diode (micro LED) display substrate, comprising providing a mother substrate comprising an array of a plurality of micro LEDs; providing a transfer substrate comprising an array of a plurality of electroactive actuators made of an electroactive material; and transferring the array of the plurality of micro LEDs from the mother substrate onto the transfer substrate;

wherein a respective one of the plurality of electroactive actuators comprises a ring-shaped frame structure substantially surrounding a central opening, the ring-shaped frame structure made of an electroactive material; the ring-shaped frame structure is configured to undergo a reversible deformation between a first state and a second state upon a change in an electric field applied on the ring-shaped frame structure, a distance between two positions on an inner wall of the ring-shaped frame structure and across the central opening having a first value in the first state and a second value in the second state, the first value being greater than the second value; and the array of the plurality of electroactive actuators has a pattern substantially the same as a pattern of the array of a plurality of micro LEDs.

Optionally, transferring the array of the plurality of micro LEDs from the mother substrate onto the transfer substrate comprises maintaining the ring-shaped frame structure in the first state; aligning the transfer substrate and the mother substrate to allow a respective one of the plurality of micro LEDs at least partially fit into the central opening; applying an electric field on the ring-shaped frame structure to maintain the ring-shaped frame structure in the second state, thereby securing the respective one of the plurality of micro LEDs by the ring-shaped frame structure; and removing the plurality of micro LEDs from the mother substrate thereby transferring the array of the plurality of micro LEDs from the mother substrate onto the transfer substrate.

Optionally, maintaining the ring-shaped frame structure in the first state comprises applying no electric field to the ring-shaped frame structure.

Optionally, the method further comprises providing a target substrate; and transferring the array of the plurality of micro LEDs from the transfer substrate onto a target substrate.

Optionally, transferring the array of the plurality of micro LEDs from the transfer substrate onto the target substrate comprises maintaining the ring-shaped frame structure in the second state; aligning the transfer substrate and the target substrate; changing the electric field applied on the ring-shaped frame structure to maintain the ring-shaped frame structure in the first state, thereby releasing the respective one of the plurality of micro LEDs from the ring-shaped frame structure; and releasing the plurality of micro LEDs from the transfer substrate onto the target substrate.

Optionally, maintaining the ring-shaped frame structure in the second state comprises applying an electric field on the ring-shaped frame structure to expand a wall of the ring-shaped frame structure toward a center of the central opening and maintain a distance between two positions on an inner wall of the ring-shaped frame structure at the second value.

Optionally, changing the electric field applied on the ring-shaped frame structure to maintain the ring-shaped frame structure in the first state comprises removing the electric field on the ring-shaped frame structure to withdraw the wall of the ring-shaped frame structure away from the center of the central opening and maintain the distance between two positions on an inner wall of the ring-shaped frame at the first value.

In one aspect, the present disclosure provides a micro light emitting diode (micro LED) display substrate, fabricated by the method described herein.

BRIEF DESCRIPTION OF THE FIGURES

The following drawings are merely examples for illustrative purposes according to various disclosed embodiments and are not intended to limit the scope of the present invention.

FIG. 11 is a flow chart illustrating a method of fabricating a transfer substrate in some embodiments according to the present disclosure.

FIG. 12 is a flow chart illustrating a method of fabricating a transfer substrate in some embodiments according to the present disclosure.

DETAILED DESCRIPTION

Figure 1A:
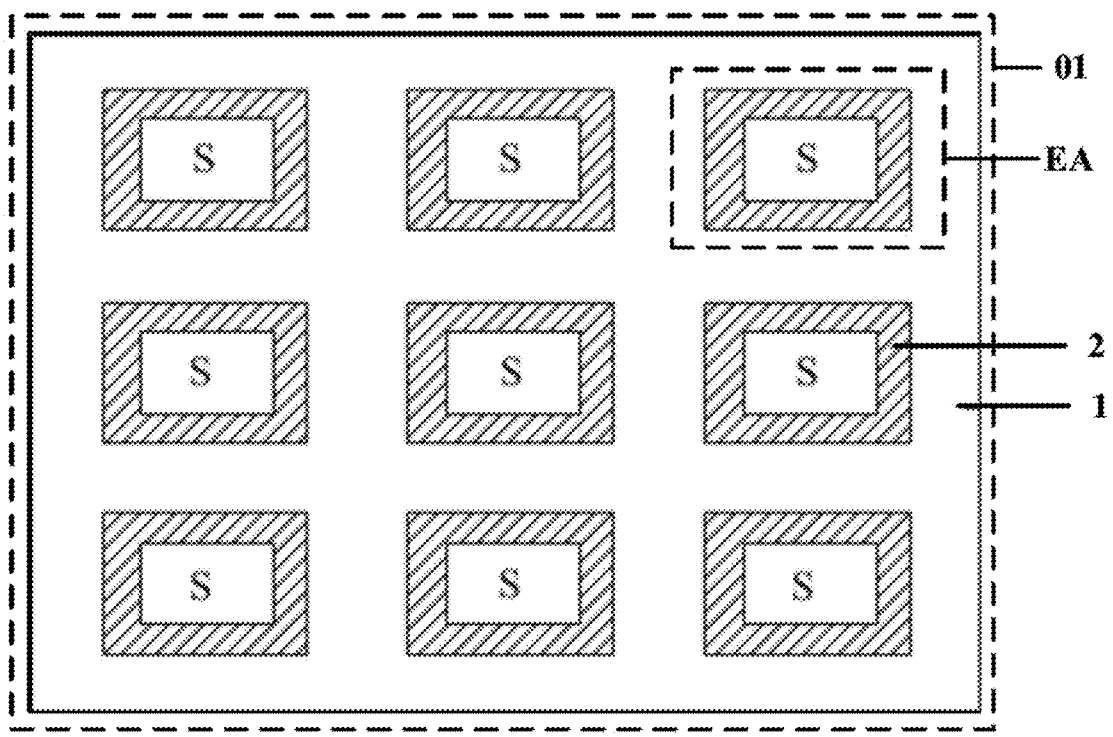
FIG. 1A is a plan view of a transfer substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The method of fabricating micro LEDs includes fabricating micro LEDs on a base substrate, transferring micro LEDs to a target substrate. There are a technical barriers to transfer micro LEDs from the base substrate to the target substrate.

Accordingly, the present disclosure provides, inter alia, a transfer substrate, a method of fabricating a micro light emitting diode display substrate, and micro light emitting diode display substrate that substantially obviate one or more of the problems due to limitations and disadvantages of the related art. In one aspect, the present disclosure provides a transfer substrate for transferring an array of a plurality of micro light emitting diodes (micro LEDs) onto a target substrate. In some embodiments, the transfer substrate includes a base substrate, and an array of a plurality of electroactive actuators. Optionally, a respective one of the plurality of electroactive actuators includes a ring-shaped frame structure substantially surrounding a central opening. Optionally, the ring-shaped frame structure made of an electroactive material. Optionally, the ring-shaped frame structure is configured to undergo a reversible deformation between a first state and a second state upon a change in an electric field applied on the ring-shaped frame structure. Optionally, a distance between two positions on an inner wall of the ring-shaped frame structure and across the central opening has a first value in the first state and a second value in the second state. Optionally, the first value is greater than the second value.

As used herein, the term "substantially surrounding" refers to surrounding at least 40% (e.g., at least 50%, at least 60%, at least 70%, at least 80%, at least 90%, at least 95%, at least 99%, and 100%) of a perimeter of an area.

As used herein, the term "micro" LED refers to the descriptive size, e.g. length or width, of the light emitting diode. Optionally, "micro" LED may be on the scale of 1 μm to approximately 300 μm, or 100 μm or less. Optionally, "micro" LED is on the scale of 50 μm to 300 μm. However, it is to be appreciated that embodiments of the present invention are not necessarily so limited, and that certain aspects of the embodiments may be applicable to larger micro LED devices or structures, and possibly smaller size scales.

As used herein the term "electroactive material" refers to a material that reversibly changes one or more characteristic body dimension by an amount depending on an applied electrical voltage. As used herein, the term "electroactive actuator" refers to an actuator in the present transfer substrate that includes an electroactive material, and is capable of reversibly changing one or more characteristic body dimension by an amount depending on an applied electrical voltage. Optionally, the electroactive material is an electrostrictive material. Stress and strain response of the electrostrictive material to an electric field is proportional to the square of the electric field. Optionally, the electroactive material is a piezoelectric material. Stress and strain response of the piezoelectric material to an electric field is proportional to the electric field.

For example, the stress and strain response to the electric field applied to the electrostrictive material may be expressed as $X=RE^2$, wherein X is the stress and strain response, R is an electrostrictive coefficient of the material, and E is a strength of the electric field applied to the electrostrictive material. A correlation exists between stress and strain response of an electrostrictive material and a strength of an electric field applied to the electrostrictive material in some embodiments. The stress and strain response of the electrostrictive material is also affected by the thickness of the material. Within a certain range of thicknesses (e.g., in the range of approximately 0.1 mm to approximately 2 mm), X is proportional to the square of the electric field, R increases as the thickness of the material decreases. Thus, a relatively larger coefficient R results in more prominent stress and strain response X, when a same electric field is applied to the electrostrictive material.

Any appropriate electrostrictive material may be used for making the electroactive layer, e.g., electrostrictive ceramics, electrostrictive polymers, etc. Examples of appropriate electrostrictive materials include, but are not limited to, a polyurethane containing material (e.g., a doped polyurethane material), polyvinylidene fluoride, lead magnesium niobate, lead magnesium niobate-lead titanate, lanthanum doped lead zirconate titanate, barium doped lead zirconate titanate, and various substitutes and derivatives thereof (e.g., doped with one or more dopant).

Any appropriate piezoelectric material may be used for making the electroactive layer. Examples of appropriate piezoelectric materials include, but are not limited to, lead zirconium titanate, berlinite, zinc oxide, barium titanate, lead titanate, and various substitutes and derivatives thereof (e.g., doped with one or more dopant).

FIG. 1 is a plan view of a transfer substrate in some embodiments according to the present disclosure. Referring to FIG. 1, the present disclosure provides a transfer substrate 01 for transferring an array of a plurality of micro LEDs onto a target substrate. In some embodiments, the transfer substrate 01 includes a base substrate 1, and an array of a plurality of electroactive actuators EA on the base substrate 1. Optionally, a respective one of the plurality of electroactive actuators EA includes a ring-shaped frame structure 2 substantially surrounding a central opening S. Optionally, the ring-shaped frame structure 2 is made of an electroactive material.

Figure 1B:
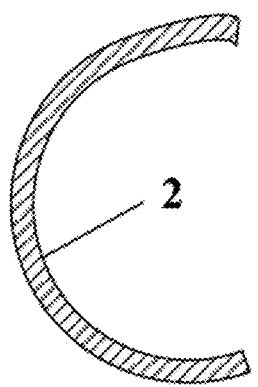
FIG. 1B is a schematic diagram of a ring-shape frame structure in some embodiments according to the present disclosure.
Figure 1C:
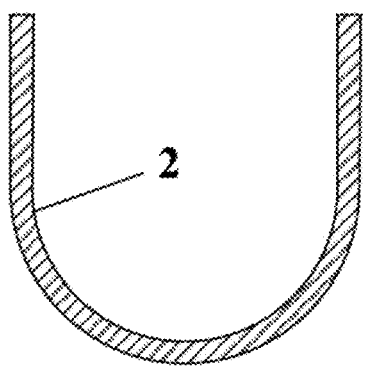
FIG. 1C is a schematic diagram of a ring-shape frame structure in some embodiments according to the present disclosure.

As used herein, the term "ring" or "ring-shape frame structure" refers to a structure or portion of a structure having a hole there through, including but not limited to a ring or doughnut shape. A ring-shape frame structure may be essentially round like a doughnut, or may be formed of a square, triangle or another shape with a hole there through. As used herein, a ring-shape frame structure does not require that the ring shape be unbroken, and the term is intended to encompass structures that are substantially closed, but that comprise a break or a gap in the ring shape. The term encompasses structures that comprise cavity, e.g., a "C" and "U"-shaped cavity. A ring-shape frame structure may consist essentially of a single ring, or it may be a component of a larger structure having additional features, e.g., additional ring structures, or non-ring-shaped features such as corners, points, strings, etc. Referring to FIG. 1A, the ring-shape frame structure 2 is a closed rectangular ring. FIG. 1B is a schematic diagram of a ring-shape frame structure in some embodiments according to the present disclosure. Referring to FIG. 1B, the ring-shape frame structure 2 is a C-shaped ring. FIG. 1C is a schematic diagram of a ring-shape frame structure in some embodiments according to the present disclosure. Referring to FIG. 1B, the ring-shape frame structure 2 is a U-shaped ring.

Figure 2:
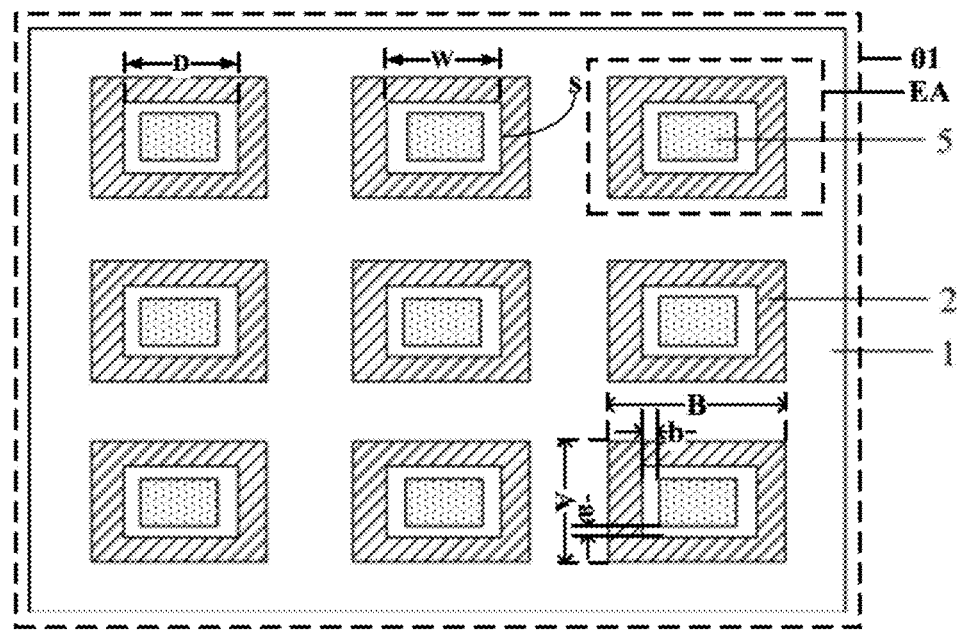
FIG. 2 is a plan view of a transfer substrate in a first state in some embodiments according to the present disclosure.
Figure 3:
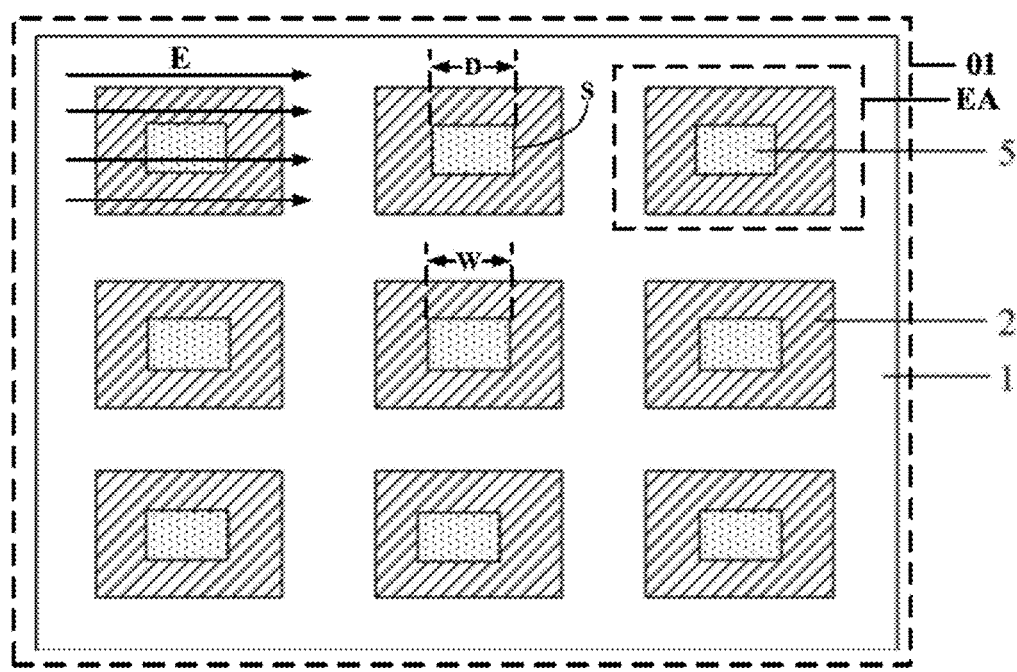
FIG. 3 is a plan view of a transfer substrate in a second state in some embodiments according to the present disclosure.

FIG. 2 is a plan view of a transfer substrate in a first state in some embodiments according to the present disclosure. FIG. 3 is a plan view of a transfer substrate in a second state in some embodiments according to the present disclosure. Referring to both FIG. 2 and FIG. 3, in some embodiments, the ring-shaped frame structure 2 is configured to undergo a reversible deformation between a first state and a second state upon a change in an electric field applied on the ring-shaped frame structure 2. In one example, a distance D between two positions on an inner wall of the ring-shaped frame structure 2 and across the central opening S has a first value in the first state and a second value in the second state, and the first value is greater than the second value. In another example, the central opening S has a width W between two inner walls of the ring-shaped frame structure 2. The width W has a third value in the first state and a fourth value in the second state. The third value is greater than the fourth value. Optionally, the third value is equal to the first value, and the fourth value is equal to the second value.

In some embodiments, the array of the plurality of electroactive actuators EA has a pattern substantially the same as a pattern of the array of a plurality of micro LEDs 5. For example, a center of a respective one of the plurality of electroactive actuators EA substantially overlaps with a center of a respective one of the plurality of micro LEDs 5. Referring to both FIG. 2 and FIG. 3, the transfer substrate 01 doesn't include a plurality of micro LEDs 5. In order to illustrate the relationships between the plurality of micro LEDs 5 and the plurality of electroactive actuators EA, the plurality of micro LEDs are shown on FIG. 2 and FIG. 3. The plurality of micro LEDs 5 are disposed on a mother substrate. Referring to FIG. 2 and FIG. 3, optionally, the respective one of the plurality of electroactive actuators EA has an inner boundary complementary to an outer boundary of the respective one of the plurality of micro LEDs 5, at least in one of the first state and the second state, e.g., in the second state.

In some embodiments, referring to FIG. 2, the central opening S in the first state has a size greater than a size of a respective one of the plurality of micro LEDs 5. The respective one of the plurality of micro LEDs is freely removable from the central opening S in the first state.

In some embodiments, referring to FIG. 3, the central opening S in the second state has a size equal to or less than the size of the respective one of the plurality of micro LEDs 5. The ring-shaped frame structure 2 is configured to secure the respective one of the plurality of micro LEDs 5.

In some embodiments, referring to FIG. 2, an electric field E is not applied to the ring-shaped frame structure 2 in the first state. Optionally, the electric field E in the first state has a value smaller than a value of the electric field E in the second state.

Upon application of an electric field on the ring-shaped frame structure 2, or upon an increase of the electric field E applied on the ring-shaped frame structure 2, the ring-shaped frame structure 2 is configured to transition from the first state to the second state. Referring to FIG. 3, a wall of the ring-shaped frame structure 2 is configured to expand toward a center of the central opening S to reduce the distance D between two positions on an inner wall of the ring-shaped frame structure 2 from the first value to the second value. In another example, the wall of the ring-shaped frame structure 2 is configured to expand toward a center of the central opening S to reduce a width W of the central opening S between two inner walls of the ring-shaped frame structure from the first value to the second value.

Upon removal of the electric field E on the ring-shaped frame structure 2, or upon a decrease in the electric field E applied on the ring-shaped frame structure 2, the ring-shaped frame structure 2 is configured to transition from the second state to the first state. Referring to FIG. 2, the wall of the ring-shaped frame structure 2 is configured to withdraw away from the center of the central opening S to increase the distance D between two positions on an inner wall of the ring-shaped frame structure from the second value to the first value. In another example, the wall of the ring-shaped frame structure 2 is configured to withdraw away from the center of the central opening S to increase the width W of the central opening S between two inner walls of the ring-shaped frame structure from the second value to the first value.

In some embodiments, an electric field E is not applied to the ring-shaped frame structure 2 in the second state. Optionally, the electric field E in the second state has a value smaller than a value of the electric field E in the first state.

Upon application of an electric field on the ring-shaped frame structure 2, or upon an increase of the electric field E applied on the ring-shaped frame structure 2, the ring-shaped frame structure 2 is configured to transition from the second state to the first state. Accordingly, a wall of the ring-shaped frame structure 2 is configured to withdraw away from a center of the central opening S to increase the distance D between two positions on an inner wall of the ring-shaped frame structure 2 from the second value to the first value. In another example, the wall of the ring-shaped frame structure 2 is configured to withdraw away from a center of the central opening S to increase a width W of the central opening S between two inner walls of the ring-shaped frame structure from the second value to the first value.

Upon removal of the electric field E on the ring-shaped frame structure 2, or upon a decrease in the electric field E applied on the ring-shaped frame structure 2, the ring-shaped frame structure 2 is configured to transition from the first state to the second state. Accordingly, the wall of the ring-shaped frame structure 2 is configured to expand toward the center of the central opening S to reduce the distance D between two positions on an inner wall of the ring-shaped frame structure from the first value to the second value. In another example, the wall of the ring-shaped frame structure 2 is configured to expand toward the center of the central opening S to reduce the width W of the central opening S between two inner walls of the ring-shaped frame structure from the first value to the second value.

In some embodiments, the transfer substrate 01 is used for transfer a plurality of micro LEDs from a mother substrate to a target substrate. For example, the mother substrate includes a plurality of micro LEDs fabricated on a growth substrate, and the target substrate is a thin film transistor array substrate including a plurality of thin film transistors for driving light emission of the plurality of micro LEDs. In one example, referring to FIG. 2, an electric field E is not applied to the ring-shaped frame structure 2, or only a relatively small electrical field is applied on the ring-shaped frame structure 2, an orthographic projection of the central opening S on a base substrate 1 has a size greater than a size of an orthographic projection of the respective one of the plurality of micro LEDs 5 on the base substrate 1. After the transfer substrate 01 and the mother substrate having a plurality of micro LEDs are aligned to allow the respective one of the plurality of the micro LEDs 5 at least partially fit into the central opening S, referring to FIG. 3, an electric field E is applied to the ring-shaped frame structure 2, or the electric field E applied to the ring-shaped frame structure 2 is increased, a wall of the ring-shaped frame structure 2 expands toward the center of the central opening S, the orthographic projection of the central opening S on the base substrate 1 has a size equal or less than the size of the orthographic projection of the respective one of the plurality of micro LEDs 5 on the base substrate 1. The ring-shaped frame structure 2 can secure the respective one of the plurality of micro LEDs 5, and subsequently the plurality of the micro LEDs 5 may be removed from the mother substrate. After the transfer substrate 01 is moved and aligned with the target substrate, the electric filed E is removed or decreased. The wall of the ring-shaped frame structure 2 withdraws away from the center of the central opening S, the respective one of the plurality of micro LEDs 5 can be freely removable from the central opening S onto the target substrate. The plurality of the micro LEDs 5 can be effectively and accurately transferred from the mother substrate to the target substrate.

In order to secure the respective one of the plurality of micro LEDs 5 using the ring-shaped frame structure 2, the shape and/or size of respective one of the plurality of micro LEDs 5 is required to be complementary to the shape and/or size of the ring-shaped frame structure 2 so that the respective one of the plurality of micro LEDs 5 can be fit into the ring-shaped frame structure 2 in at least one state, e.g., in the first state. The ring-shaped frame structures (e.g. the plurality of electroactive actuators EA) should be formed on the transfer substrate 01 having a pattern substantially the same as a pattern of the plurality of the micro LEDs 5 on the mother substrate.

The ring-shaped frame structure 2 may have various shapes. Example of suitable shapes of the ring-shaped frame structure 2 include, but are not limited to a square shape, a rectangular shape, a circular shape, a trapezoidal shape, a closed ring shape, or an open ring shape. Optionally, the ring-shaped frame structure 2 has a closed ring shape. In at least one state, the respective one of the plurality of micro LEDs 5 is surrounded by a wall of the ring-shaped frame structure 2. Upon the application of the electric field E on the ring-shaped frame structure 2, or upon an increase of the electric field E applied on the ring-shaped frame structure 2, the wall of the ring-shaped frame structure 2 expands toward the center of the central opening S to secure the respective one of the plurality of micro LEDs. Optionally, the ring-shaped frame structure 2 is formed by two C-shaped structures whose openings facing each other. Optionally, the ring-shaped frame structure 2 is formed by two U-shaped structures whose openings facing each other. Optionally, the ring-shaped frame structure 2 is formed by two linear bar facing each other.

Referring to FIG. 2, for example, the ring-shaped frame structure 2 is a rectangular ring structure. A width of the ring-shaped frame structure 2 is A. A length of the ring-shaped frame structure 2 is B. A shortest distance between a position on a boundary of the respective one of the plurality of micro LEDs 5 and a position of an inner wall of the length of the ring-shaped frame structure 2 is a. A shortest distance between a position on a boundary of the respective one of the plurality of micro LEDs 5 and a position of an inner wall of the width of the ring-shaped frame structure 2 is b. The relations between A, B, a, and b should satisfy the following equation: A:B=a:b.

The ring-shaped frame structures may be formed to have various appropriate arrangement patterns, e.g. various appropriate arrangement patterns of the plurality of electroactive actuators EA. Examples of suitable arrangement patterns of the ring-shaped frame structures include, but are not limited to an array pattern having a plurality of rows of electroactive actuators EA and a plurality of columns of electroactive actuators EA.

The ring-shaped frame structure 2 is made of an electroactive material. The electroactive material can expend when an electric field is applied on it, and shrink when the electric field is removed from the electroactive material.

Various appropriate electroactive materials may be used for making the ring-shaped frame structure 2. Examples of electroactive materials suitable for making the ring-shaped frame structure 2 include, but are not limited to, zinc oxide, lead magnesium niobate, lead magnesium niobate-lead titanate, lead lanthanum zirconate titanate, lead barium zirconate titanate, lead zirconate titanate. Optionally, the ring-shaped frame structure 2 further includes a matrix through which the electroactive material is dispersed. Examples of matrix material include various polymers such as acrylate, silicone rubber, and polyurethane. Optionally, the ring-shaped frame structure 2 may be made of zinc oxide. Zinc oxide is strength, and has good piezoelectric properties, and good optical properties. The ring-shaped frame structure 2 made of zinc oxide has a strength sufficient to secure and move the respective one of the plurality of micro LEDs without damaging the ring-shaped frame structure 2. The wall of the ring-shaped frame structure 2 made of zinc oxide can significantly expand to secure the respective one of the plurality of the micro LEDs.

Figure 4:
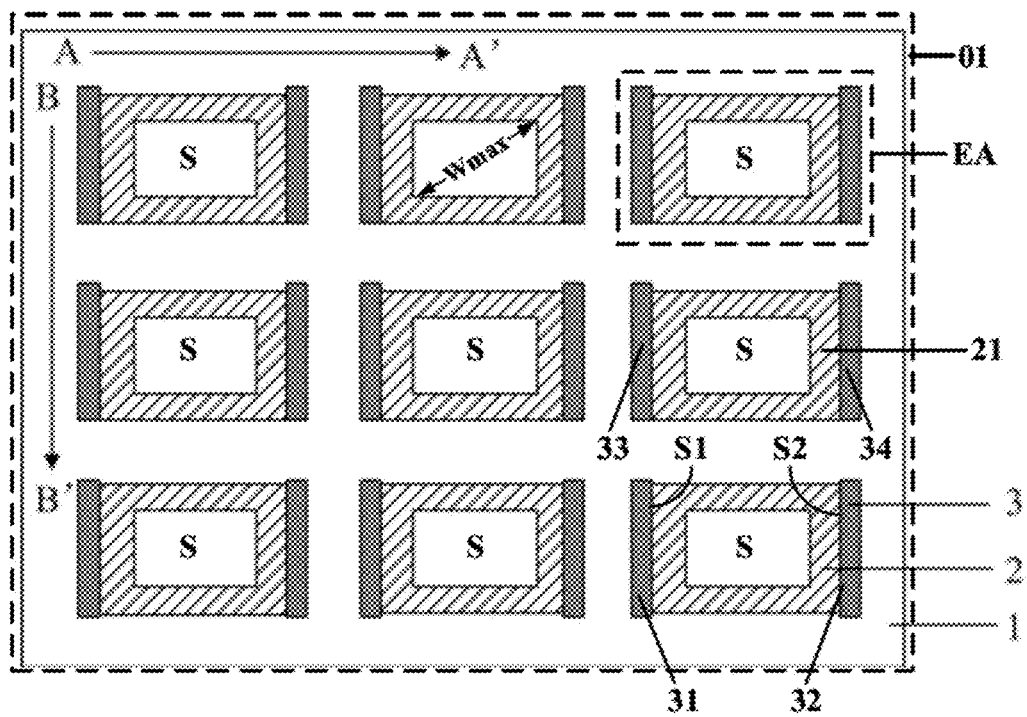
FIG. 4 is a plan view of a transfer substrate illustrating positions of a controlling electrode in some embodiments according to the present disclosure.

FIG. 4 is a plan view of a transfer substrate illustrating positions of a controlling electrode in some embodiments according to the present disclosure. In some embodiments, referring to FIG. 4, a respective one of the plurality of electroactive actuators EA further includes a controlling electrode 3. Optionally, the plurality of electroactive actuators EA are disposed in array on the base substrate 1, e.g. a plurality of ring-shaped frame structures 2 respectively correspond to the plurality of electroactive actuators EA are disposed in array on the base substrate 1. Optionally, the controlling electrode 3 is configured to apply an electric field on the ring-shaped frame structure 2.

Optionally, the controlling electrode 3 includes a first controlling sub-electrode 31 on a first side S1 of the ring-shaped frame structure 2 of the respective one of the plurality of electroactive actuators EA. Optionally, the controlling electrode 3 includes a second controlling sub-electrode 32 on a second side S2 of the ring-shaped frame structure 2 of the respective one of the plurality of electroactive actuators EA. Optionally, the first side S1 of the ring-shaped frame structure 2 is opposing to the second side S2 of the ring-shaped frame structure 2.

In some embodiments, in a same row of the plurality of electroactive actuators EA, first controlling sub-electrodes for respectively controlling two adjacent ring-shaped frame structures are separated from each other. Optionally, second controlling sub-electrodes for respectively controlling two adjacent ring-shaped frame structures are separated from each other. For example, a first controlling sub-electrode 31 is disposed on a first side S1 of a ring-shaped frame structure 2 along a direction from B to B', and a second controlling sub-electrode 32 is disposed on a second side S2 of the ring-shaped frame structure 2 along the direction from B to B'. For example, the first controlling sub-electrode 31 has a length along the direction from B to B' equal or greater than a length of the first side S1. The first controlling sub-electrode 31 for controlling a respective one of the ring-shaped frame structures 21 is not connected with an adjacent first controlling sub-electrode 33 for controlling an adjacent ring-shaped frame structures 21. The second controlling sub-electrode 32 for controlling a respective one of the ring-shaped frame structures 21 is not connected with an adjacent second controlling sub-electrode 34 for controlling the adjacent ring-shaped frame structures 21. Optionally, the transfer substrate 01 further includes a plurality of signal lines configured to independently provide voltage signals to the controlling electrode, e.g., provide voltage signals independently to each of the controlling sub-electrodes.

Figure 5:
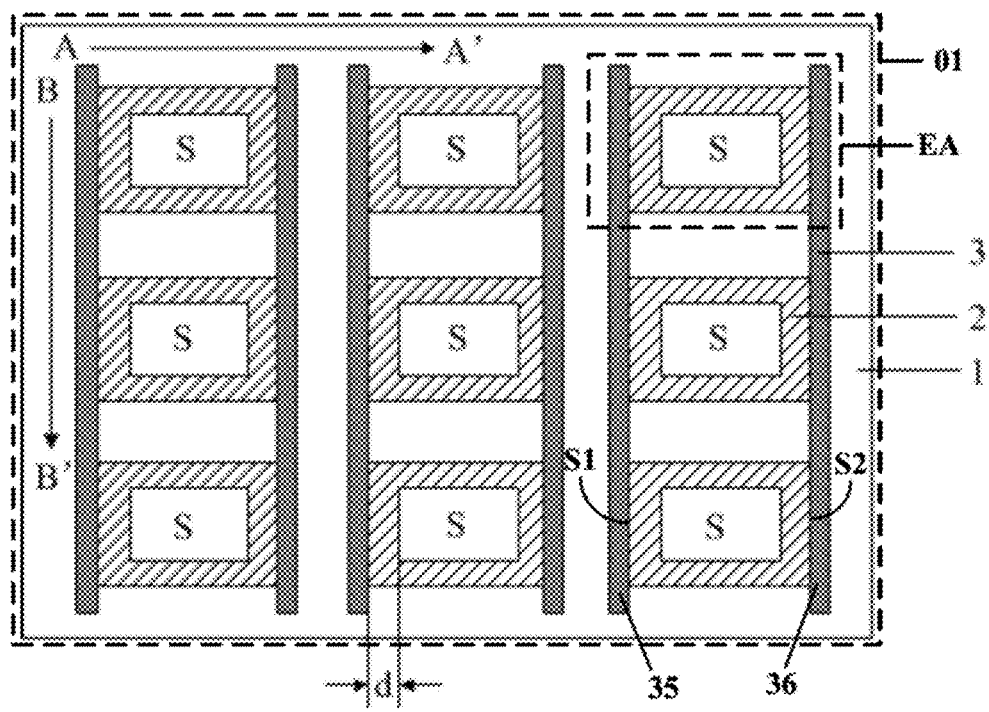
FIG. 5 is a plan view of a transfer substrate illustrating positions of a controlling electrode in some embodiments according to the present disclosure.

FIG. 5 is a plan view of a transfer substrate illustrating positions of a controlling electrode in some embodiments according to the present disclosure. In some embodiment, referring to FIG. 5, a same column of the array of the plurality of electroactive actuators EA shares a same integral first controlling sub-electrode 35 along a column direction of the army of the plurality of electroactive actuators EA. In some embodiments, the same column of the array of the plurality of electroactive actuators EA shares a same integral second controlling sub-electrode 36 along the column direction of the array of the plurality of electroactive actuators EA. Designing the first controlling sub-electrode and the second controlling sub-electrode to extend along a column direction of the array of the plurality of electroactive actuators would simplify the structure of circuits and the process of fabricating the transfer substrate.

In one example, the integral first controlling sub-electrode 35 extends along the direction from B to B', and the integral second controlling sub-electrode 36 extends along the direction from B to B'.

Figure 6:
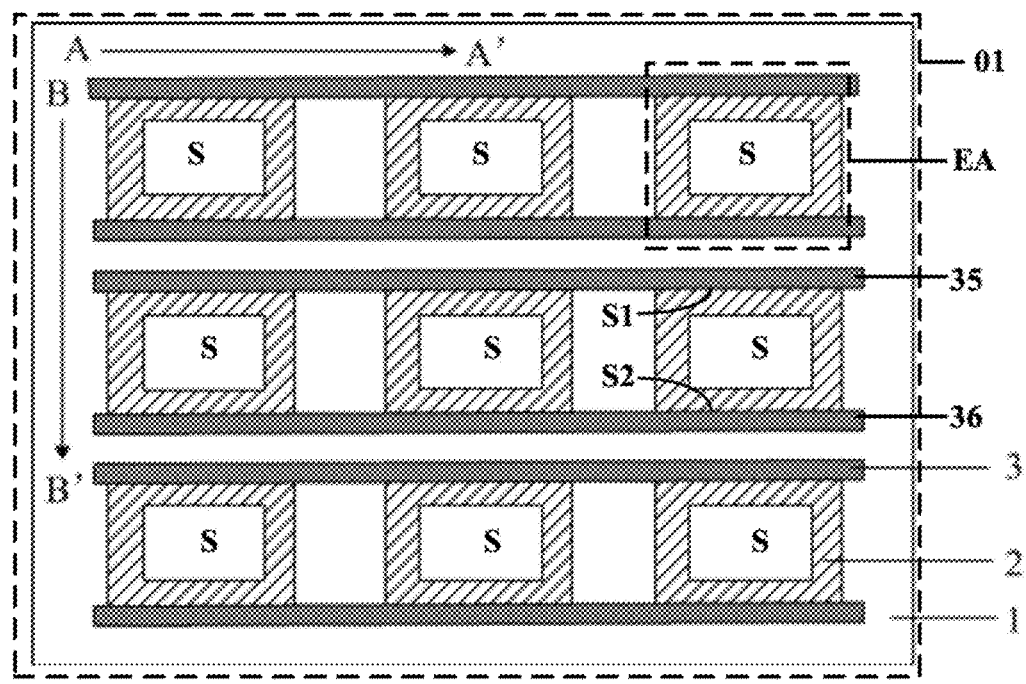
FIG. 6 is a plan view of a transfer substrate illustrating positions of a controlling electrode in some embodiments according to the present disclosure.

FIG. 6 is a plan view of a transfer substrate illustrating positions of a controlling electrode in some embodiments according to the present disclosure. In some embodiment, referring to FIG. 5, a same row of the array of the plurality of electroactive actuators EA shares a same integral first controlling sub-electrode 35 along a row direction of the array of the plurality of electroactive actuators EA. In some embodiments, the same row of the array of the plurality of electroactive actuators EA shares a same integral second controlling sub-electrode 36 along the row direction of the array of the plurality of electroactive actuators EA. Designing the first controlling sub-electrode and the second controlling sub-electrode to extend along a row direction of the array of the plurality of electroactive actuators would simplify the structure of circuits and the process of fabricating the transfer substrate.

In another example, the integral first controlling sub-electrode 35 extends along the direction from A to A', and the integral second controlling sub-electrode 36 extends along the direction from A to A'.

In some embodiments, shapes of the integral first controlling sub-electrode 35 and the integral second controlling sub-electrode 36 are a strip shapes or bar shapes. Optionally, the integral first controlling sub-electrode 35 and the integral second controlling sub-electrode 36 are made of tin indium oxide.

In some embodiments, referring to FIG. 4, a maximum width Wmax of the central opening S between two positions on an inner wall of the ring-shaped frame structure 2 is in a range of approximately 1 μm to approximately 100 μm, e.g., approximately 1 μm to approximately 10 μm, approximately 10 m to approximately 20 μm, approximately 20 μm to approximately 30 μm, approximately 30 μm to approximately 40 μm, approximately 40 μm to approximately 50 μm, approximately 50 μm to approximately 60 μm, approximately 60 μm to approximately 70 μm, approximately 70 μm to approximately 80 μm, approximately 80 μm to approximately 90 μm, approximately 90 μm to approximately 100 μm. In one example, the central opening S in FIG. 4 has rectangular shape, the maximum width Wmax of the central opening S between two positions on an inner wall of the ring-shaped frame structure is a length of a diagonal of the rectangular shape. In another example, the central opening S has a round shape, the maximum width Wmax of the central opening S between two positions on an inner wall of the ring-shaped frame structure is a diameter of the round shape.

In some embodiments, referring to FIG. 5, a thickness d of a wall of the ring-shaped frame structure 2 is in a range of approximately 1 μm to approximately 100 μm, e.g., approximately 1 μm to approximately 10 μm, approximately 10 μm to approximately 20 μm, approximately 20 μm to approximately 30 μm, approximately 30 μm to approximately 40 μm, approximately 40 μm to approximately 50 μm, approximately 50 μm to approximately 60 μm, approximately 60 μm to approximately 70 μm, approximately 70 μm to approximately 80 μm, approximately 80 μm to approximately 90 μm, approximately 90 μm to approximately 100 μm. For example, the thickness d of the wall of the ring-shaped frame structure 2 within a range of approximately 1 μm to approximately 100 μm allows the ring-shaped frame structure 2 to firmly secure and move a respective one of the plurality of micro LEDs. The thickness d of the wall of the ring-shaped frame structure 2 within a range of approximately 1 μm to approximately 100 μm can match the distribution density of the micro LEDs on the mother substrate. If the ring-shaped frame structure 2 is too thin, it can be easily damaged and cannot perform the process of transfer.

Figure 7:
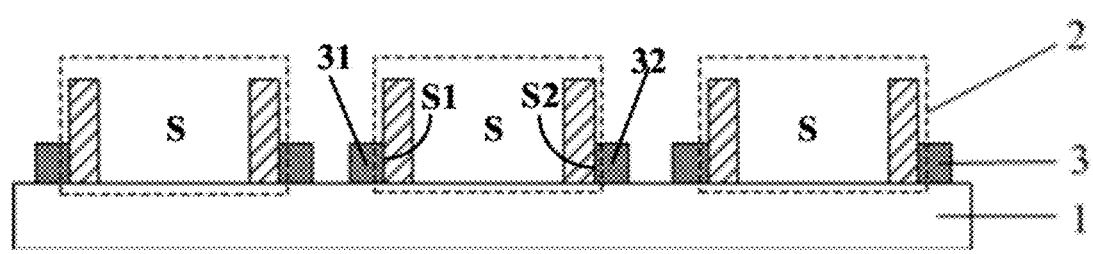
FIG. 7 is a cross-sectional view of a transfer substrate illustrating a controlling electrode and a ring-shaped frame structure on a same layer in some embodiments according to the present disclosure.

FIG. 7 is a cross-sectional view of a transfer substrate illustrating a controlling electrode and a ring-shaped frame structure on a same layer in some embodiments according to the present disclosure. Referring to FIG. 7, in some embodiments, the controlling electrode 3 and the ring-shaped frame structure 2 are on a same layer. Optionally, the first controlling sub-electrode 31 is on a side of a wall of the ring-shaped frame structure 2 away from a center of the central opening S. Optionally, the second controlling sub-electrode 32 is on a side of a wall of the ring-shaped frame structure 2 away from the center of the central opening S. As discussed previously, the first controlling sub-electrode 31 is on a first side of the ring-shaped frame structure 2 of the respective one of the plurality of electroactive actuators, and the second controlling sub-electrode 32 is on a second side of the ring-shaped frame structure 2 of the respective one of the plurality of electroactive actuators. Optionally, the first side is substantially opposite to the second side.

Figure 8:
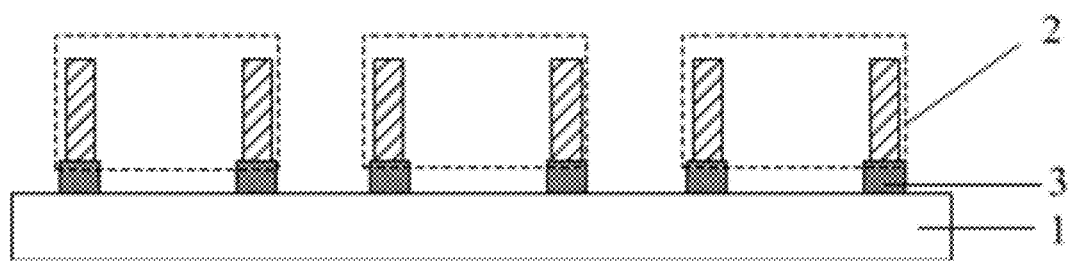
FIG. 8 is a cross-sectional view of a transfer substrate illustrating a ring-shaped frame structure is on a side of a controlling electrode away from a base substrate in some embodiments according to the present disclosure.

FIG. 8 is a cross-sectional view of a transfer substrate illustrating a ring-shaped frame structure is on a side of a controlling electrode away from a base substrate in some embodiments according to the present disclosure. Referring to FIG. 7, in some embodiments, the ring-shaped frame structure 2 is on a side of the controlling electrode 3 away from the base substrate 1. Optionally, an orthographic projection of the ring-shaped frame structure 2 on the base substrate 1 at least partially overlaps with an orthographic projection of the controlling electrode 3 on the base substrate 1. Optionally, the orthographic projection of the controlling electrode 3 on the base substrate 1 covers the orthographic projection of the ring-shaped fame structure 2 on the base substrate 1. Optionally, the orthographic projection of the ring-shaped frame structure 2 on the base substrate 1 covers the orthographic projection of the controlling electrode 3 on the base substrate 1.

Figure 9:
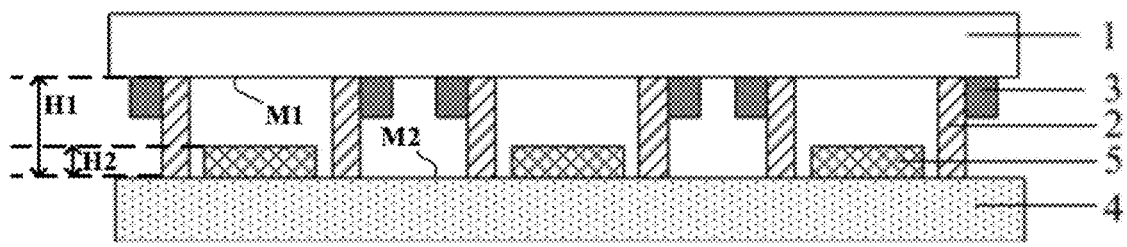
FIG. 9 is a cross-sectional view of a transfer substrate and a mother substrate illustrating a relationship between a height of a ring-shaped frame structure and a height of a respective one of a plurality of micro LEDs in some embodiments according to the present disclosure.

FIG. 9 is a cross-sectional view of a transfer substrate and a mother substrate illustrating a relationship between a height of a ring-shaped frame structure and a height of a respective one of a plurality of micro LEDs in some embodiments according to the present disclosure. Referring to FIG. 9, a height H1 of the ring-shaped frame structure 2 along a direction perpendicular to a main surface M1 of the base substrate 1 is equal to or greater than one half of a height H2 of a respective one of the plurality of micro LEDs 5 (relative to a main surface M2 of the mother substrate 4) to be transferred. The ring-shaped frame structure 2 is a height sufficient to secure and move the respective one of the plurality of micro LEDs 5 from the mother substrate 4, and prevent the respective one of the plurality of micro LEDs 5 from contacting with the transfer substrate 01, as inadvertent contacting may cause damages to the respective one of the plurality of LEDs 5.

Figure 10:
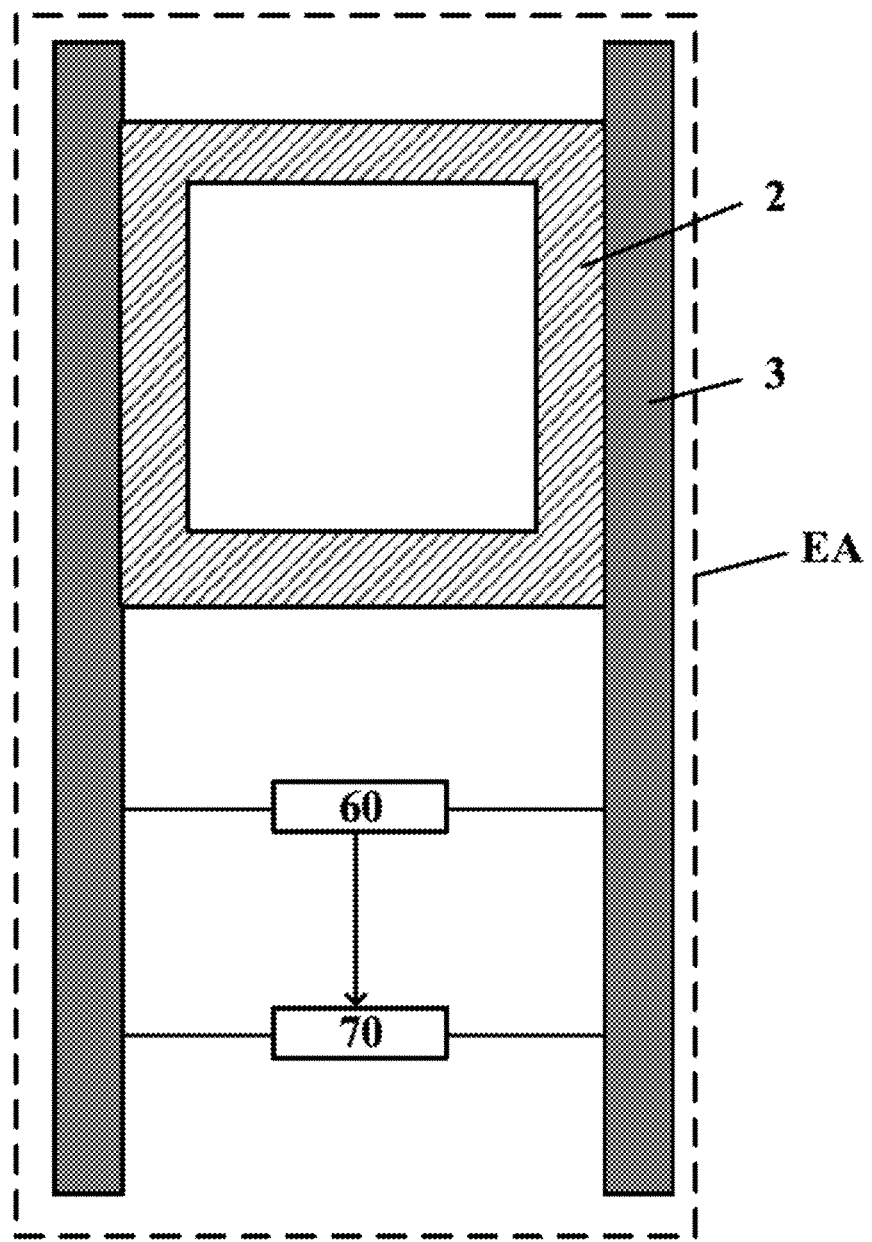
FIG. 10 is a schematic diagram illustrating a voltage provider and a voltage controller controlling a voltage applied to a controlling electrode in some embodiments according to the present disclosure.

FIG. 10 is a schematic diagram illustrating a voltage provider and a voltage controller controlling a voltage applied to a controlling electrode in some embodiments according to the present disclosure. Referring to FIG. 10, in some embodiments, a respective one of the plurality of electroactive actuators EA further includes a voltage provider 70 providing a voltage to the controlling electrode 3; and a voltage controller 60 detecting the voltage applied to the controlling electrode 3 and sending feedback to the voltage provider 70. Optionally, the voltage provider 70 adjusts the voltage according to the feedback from the voltage controller 60.

In some embodiments, the voltage controller 60 obtains a first voltage allowing the distance between two positions on an inner wall of the ring-shaped frame structure 2 having a first value in the first state, and a second voltage allowing the distance between two positions on an inner wall of the ring-shaped frame structure 2 having a second value in the second state. Optionally, in the first state, the voltage controller 60 calculates a difference between the first voltage and the voltage applied to the controlling electrode 3 to send a feedback to the voltage provider 70. Optionally, in the second state, the voltage controller 60 calculates a difference between the second voltage and the voltage applied to the controlling electrode 3 to send a feedback to the voltage provider 70.

In one example, in the second state, the voltage provider 70 applies a voltage on the controlling electroder 3. The voltager controller 60 detects and obtains the value of the voltage applied on the controlling electrode 3. The voltage controller 60 compares the value of the voltage applied on the controlling electrode 3 with the value of the second voltage. When the value of the voltage applied on the controlling electrode 3 is greater than the value of the second voltage, the voltage controller 60 sends a feedback to the voltage provider 70 to decrease the value of the voltage applied on the controlling electrode 3. When the value of the voltage applied on the controlling electrode 3 is smaller than the value of the second voltage, the voltage controller 60 sends a feed back to the voltage provider 70 to increase the value of the voltage applied on the controlling electroder 3.

In another example, in the first state, the voltage provider 70 applies a voltage on the controlling electroder 3. The voltager controller 60 detects and obtains the value of the voltage applied on the controlling electrode 3. The voltage controller 60 compares the value of the voltage applied on the controlling electrode 3 with the value of the first voltage. When the value of the voltage applied on the controlling electrode 3 is greater than the value of the first voltage, the voltage controller 60 sends a feedback to the voltage provider 70 to decrease the value of the voltage applied on the controlling electrode 3. When the value of the voltage applied on the controlling electrode 3 is smaller than the value of the first voltage, the voltage controller 60 sends a feed back to the voltage provider 70 to increase the value of the voltage applied on the controlling electroder 3.

In another aspect, the present disclosure also provides a method of fabricating a transfer substrate. FIG. 11 is a flow chart illustrating a method of fabricating a transfer substrate in some embodiments according to the present disclosure. Referring to FIG. 11, a method of fabricating a transfer substrate includes forming an electroactive material layer on a base substrate; and forming an array of a plurality of electroactive actuators on a base substrate.

Optionally, forming a respective one of the plurality of electroactive actuators includes forming a ring-shaped frame structure substantially surrounding a central opening, the ring-shaped frame structure made of an electroactive material. Optionally, the ring-shaped frame structure is formed to undergo a reversible deformation between a first state and a second state upon a change in an electric field applied on the ring-shaped frame structure. Optionally, a distance between two positions on an inner wall of the ring-shaped frame structure and across the central opening has a first value in the first state and a second value in the second state. The first value is greater than the second value. Optionally, the central opening has a width between two inner walls of the ring-shaped frame structure, the width having a first value in the first state and a second value in the second state. The first value is greater than the second value.

Optionally, the array of the plurality of electroactive actuators has a pattern substantially the same as a pattern of the array of a plurality of micro LEDs. For example, a center of a respective one of the plurality of electroactive actuators substantially overlaps with a center of a respective one of the plurality of micro LEDs.

In some embodiments, the electroactive material layer is etched using a first photolithography process to form a plurality of ring-shaped frame structures. Optionally, the plurality of ring-shaped frame structures are formed in an array pattern.

FIG. 12 is a flow chart illustrating a method of fabricating a transfer substrate in some embodiments according to the present disclosure. Referring to FIG. 12, before forming the electroactive material layer on a base substrate, the method of fabricating the transfer substrate further includes forming a first controlling sub-electrode and a second controlling sub-electrode using a second photolithography process. The ring-shaped frame structure is formed so that the first controlling sub-electrode is on a first side of the ring-shaped frame structure and the second controlling sub-electrode is on a second side of the ring-shaped frame structure.

Figure 13:
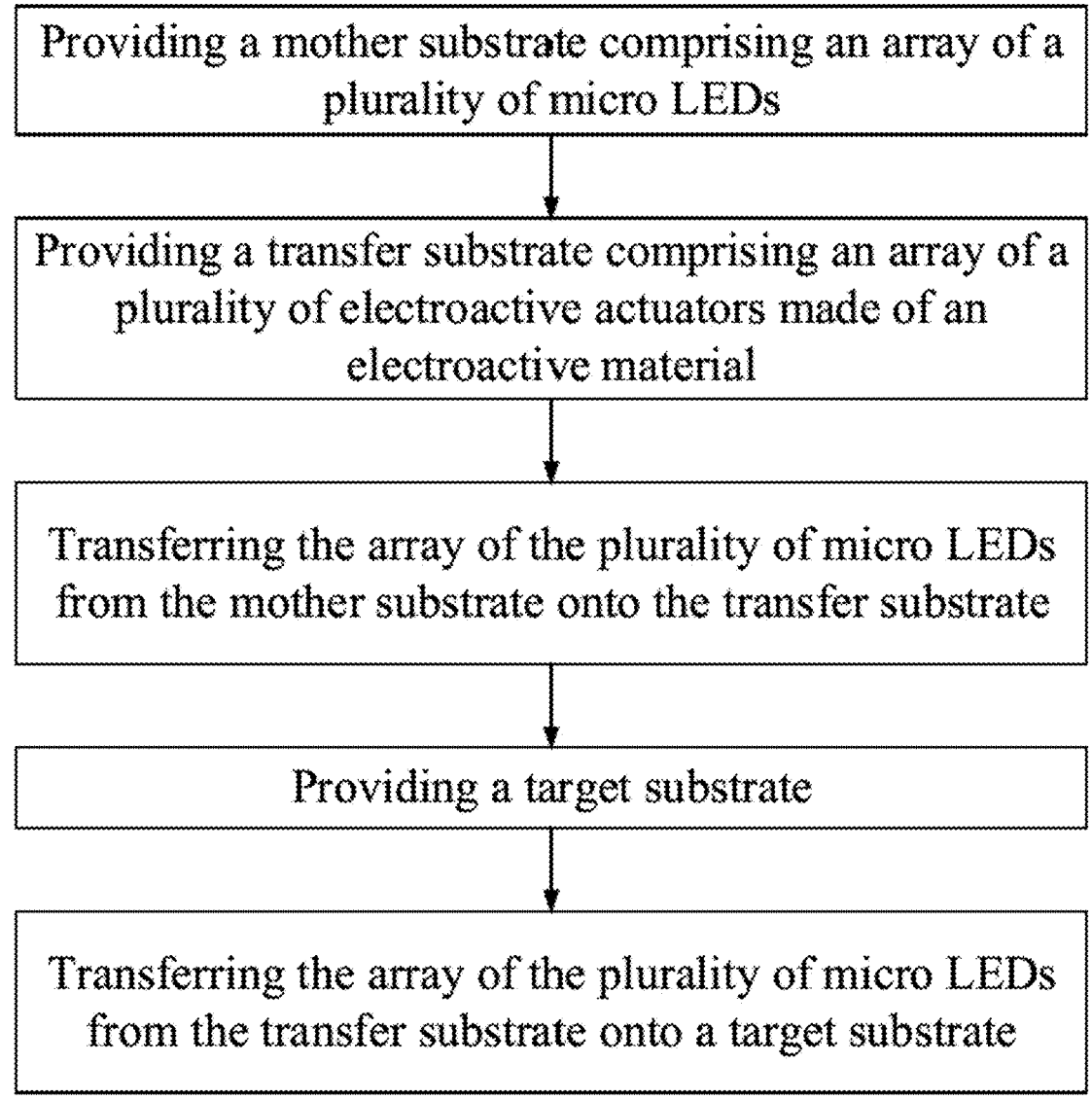
FIG. 13 is a flow chart illustrating a method of fabricating a micro light emitting diode display substrate in some embodiments according to the present disclosure.

In another aspect, the present disclosure also provides a method of fabricating a micro light emitting diode display substrate. FIG. 13 is a flow chart illustrating a method of fabricating a micro light emitting diode (micro LED) display substrate in some embodiments according to the present disclosure. Referring to FIG. 13, in some embodiments, the method of fabricating a micro LED display substrate includes providing a mother substrate including an array of a plurality of micro LEDs; providing a transfer substrate including an array of a plurality of electroactive actuators made of an electroactive material; and transferring the array of the plurality of micro LEDs from the mother substrate onto the transfer substrate.

In some embodiments, a respective one of the plurality of electroactive actuators includes a ring-shaped frame structure substantially surrounding a central opening, the ring-shaped frame structure is made of an electroactive material.

In some embodiments, the method further includes changing an electric field applied to the ring-shaped frame structure to render the ring-shaped frame structure to undergo a reversible deformation between a first state and a second state upon a change in an electric field applied on the ring-shaped frame structure. Optionally, upon the change of the electric field applied to the ring-shaped frame structure, a distance between two positions on an inner wall of the ring-shaped frame structure and across the central opening is configured to change between a first value in the first state and a second value in the second state. Optionally, the first value is greater than the second value.

In some embodiments, the array of the plurality of electroactive actuators has a pattern substantially the same as a pattern of the array of a plurality of micro LEDs.

Figure 14:
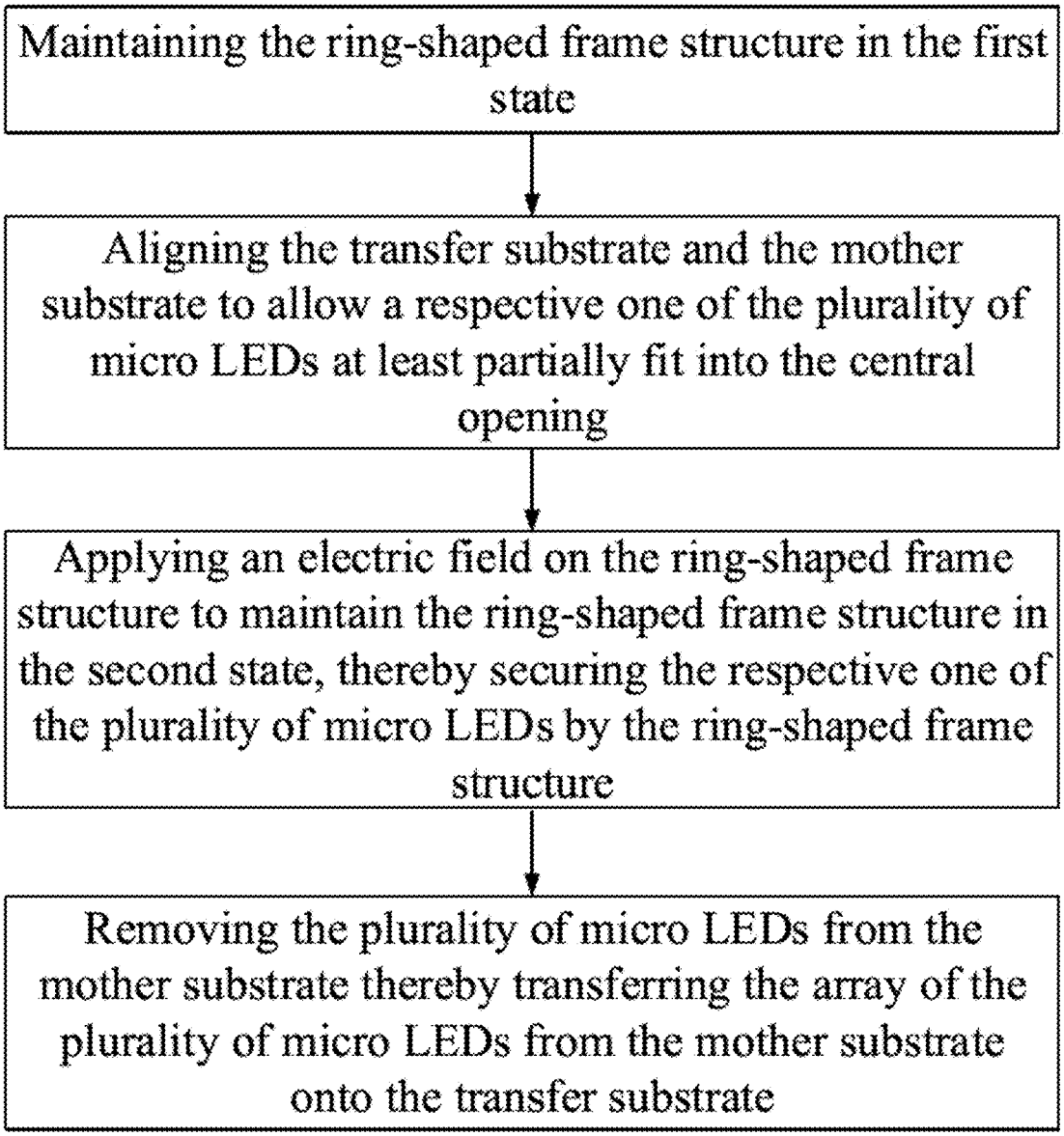
FIG. 14 is a flow chart illustrating a method of fabricating a micro light emitting diode display substrate in some embodiments according to the present disclosure.

FIG. 14 is a flow chart illustrating a method of fabricating a micro light emitting diode display substrate in some embodiments according to the present disclosure. Referring to FIG. 14, in some embodiments, transferring the array of the plurality of micro LEDs from the mother substrate onto the transfer substrate includes maintaining the ring-shaped frame structure in the first state; aligning the transfer substrate and the mother substrate to allow a respective one of the plurality of micro LEDs at least partially fit into the central opening; applying an electric field on the ring-shaped frame structure to maintain the ring-shaped frame structure in the second state, thereby securing the respective one of the plurality of micro LEDs by the ring-shaped frame structure; and removing the plurality of micro LEDs from the mother substrate thereby transferring the array of the plurality of micro LEDs from the mother substrate onto the transfer substrate.

Optionally, maintaining the ring-shaped frame structure in the first state includes applying no electric field to the ring-shaped frame structure. Optionally, maintaining the ring-shaped frame structure in the first state includes applying an electric field to the ring-shaped frame structure with a value smaller than the value of the electric field applied in the second state.

Optionally, aligning the transfer substrate and the mother substrate includes moving the transfer substrate to a position above the mother substrate, aligning a respective one of the plurality of micro LEDs with a corresponding ring-shaped frame structure, and moving the transfer substrate toward the mother substrate so that the respective one of the plurality of micro LEDs at least partially fit into the central opening of the corresponding ring-shaped frame structure.

Optionally, applying an electric field on the ring-shaped frame structure allows a wall of the ring-shaped frame structure to expand toward a center of the central opening to reduce the distance between two positions on an inner wall of the ring-shaped frame structure from the first value to the second value. The ring-shaped frame structure secures the respective one of the plurality of micro LEDs.

For example, a first controlling sub-electrode is formed on a first side of the ring-shaped frame structure of the respective one of the plurality of electroactive actuators, and a second controlling sub-electrode is formed on a second side of the ring-shaped frame structure of the respective one of the plurality of electroactive actuators. Electricity is applied on the first controlling sub-electrode and the second controlling sub-electrode to allow the ring-shaped frame structure to perform a reversible deformation.

Figure 15:
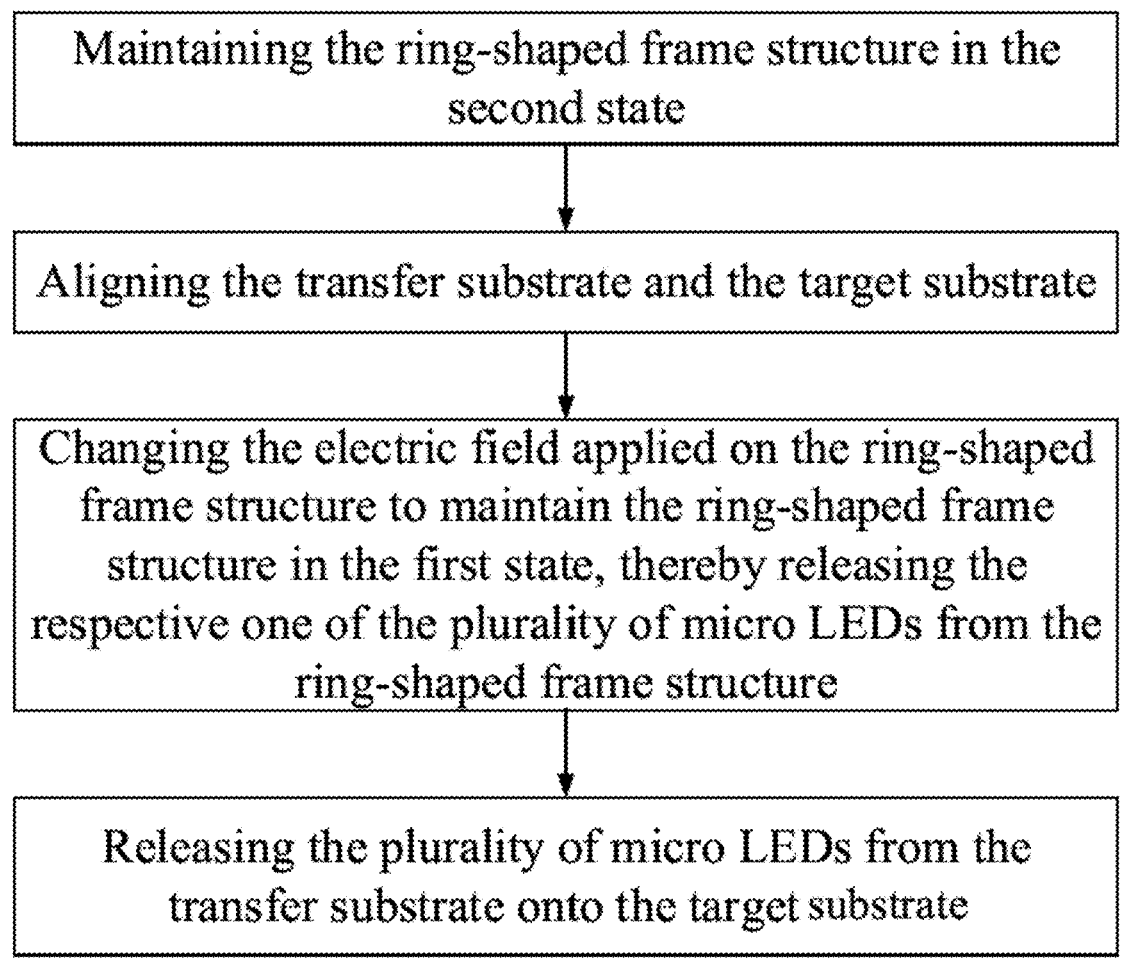
FIG. 15 is a flow chart illustrating a method of fabricating a micro light emitting diode display substrate in some embodiments according to the present disclosure.

FIG. 15 is a flowchart illustrating a method of fabricating a micro light emitting diode display substrate in some embodiments according to the present disclosure. Referring to FIG. 15, in some embodiments, transferring the array of the plurality of micro LEDs from the transfer substrate onto a target substrate includes providing a target substrate, maintaining the ring-shaped frame structure in the second state; aligning the transfer substrate and the target substrate; changing the electric field applied on the ring-shaped frame structure to maintain the ring-shaped frame structure in the first state, thereby releasing the respective one of the plurality of micro LEDs from the ring-shaped frame structure; and releasing the plurality of micro LEDs from the transfer substrate onto the target substrate.

Optionally, maintaining the ring-shaped frame structure in the second state includes applying an electric field on the ring-shaped frame structure to expand a wall of the ring-shaped frame structure toward a center of the central opening and maintain a distance between two positions on an inner wall of the ring-shaped frame structure at the second value.

Optionally, aligning the transfer substrate and the target substrate includes moving the transfer substrate in a direction away from the mother substrate, moving the transfer substrate to a position above the target substrate, aligning a respective one of the plurality of micro LEDs with one or more bonding pads on the target substrate, and moving the target substrate toward the target substrate.

Optionally, changing the electric field applied on the ring-shaped frame structure to maintain the ring-shaped frame structure in the first state includes removing the electric field on the ring-shaped frame structure to withdraw the wall of the ring-shaped frame structure away from the center of the central opening and maintain the distance between two positions on an inner wall of the ring-shaped frame at the first value.

Optionally, aligning the transfer substrate and the mother substrate includes performing a first alignment between the transfer substrate and the mother substrate using a first alignment mark; and performing a second alignment between the transfer substrate and the mother substrate using a second alignment mark. Optionally, a width of the first alignment mark is greater than a width of the second alignment mark.

Optionally, aligning the transfer substrate and the target substrate includes performing a first alignment between the transfer substrate and the target substrate using a first alignment mark; and performing a second alignment between the transfer substrate and the target substrate using a second alignment mark. Optionally, a width of the first alignment mark is greater than a width of the second alignment mark.

Figure 16:
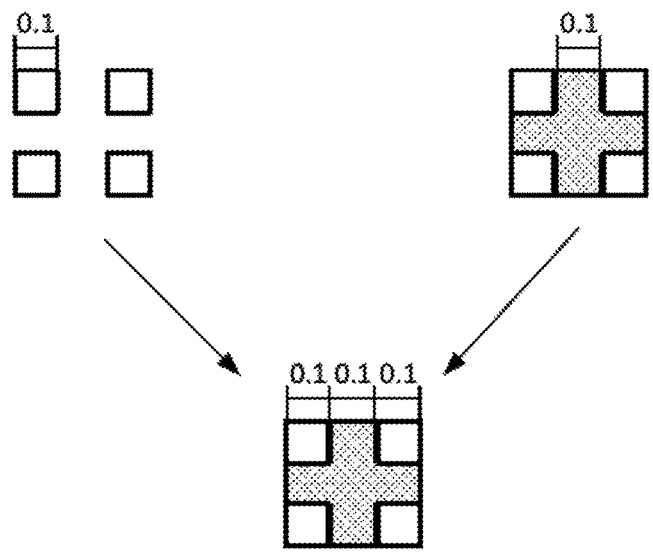
FIG. 16 is a schematic diagram illustrating an alignment between two substrates in some embodiments according to the present disclosure.

FIG. 16 is a schematic diagram illustrating an alignment between two substrates in some embodiments according to the present disclosure. In one example, referring to FIG. 16, the first alignment mark used in aligning two substrates has a width of approximately 0.1 mm. Various shapes may be used as the first alignment mark to align two substrates. For example, the first alignment mark has two first sub-marks having complementary shapes. Optionally, one of the two first sub-marks may have a cross shape.

Figure 17:
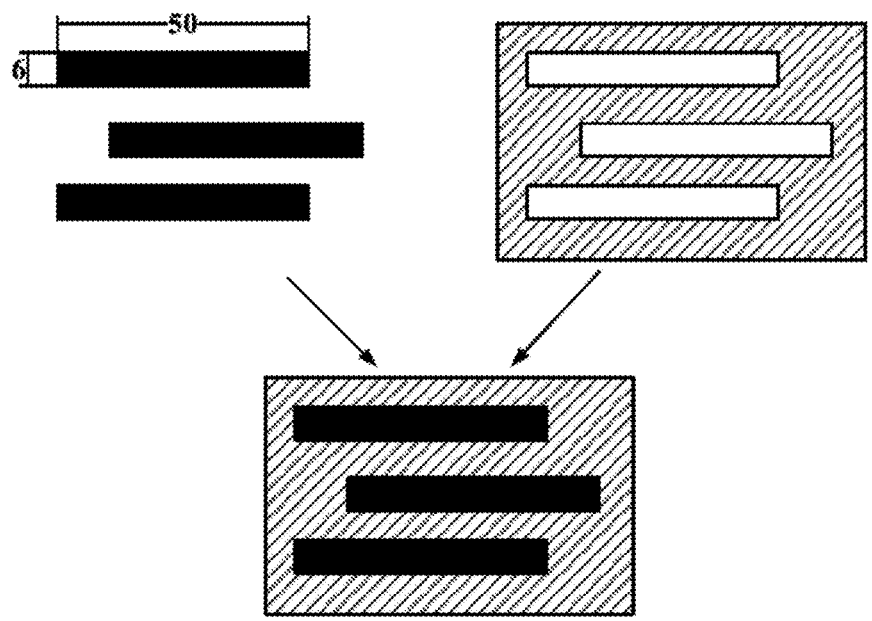
FIG. 17 is a schematic diagram illustrating an alignment between two substrates in some embodiments according to the present disclosure.

FIG. 17 is a schematic diagram illustrating an alignment between two substrates in some embodiments according to the present disclosure. In another example, referring to FIG. 17, the second alignment mark used in aligning two substrates has a width of approximately 6 μm. Various shapes may be used as the second alignment mark to align two substrates. In one example, the second alignment mark has two second sub-marks having complementary shapes. In another example, a sub-second mark on one substrate should has a shape complementary to the other sub-second mark on the other substrate.

Figure 18:
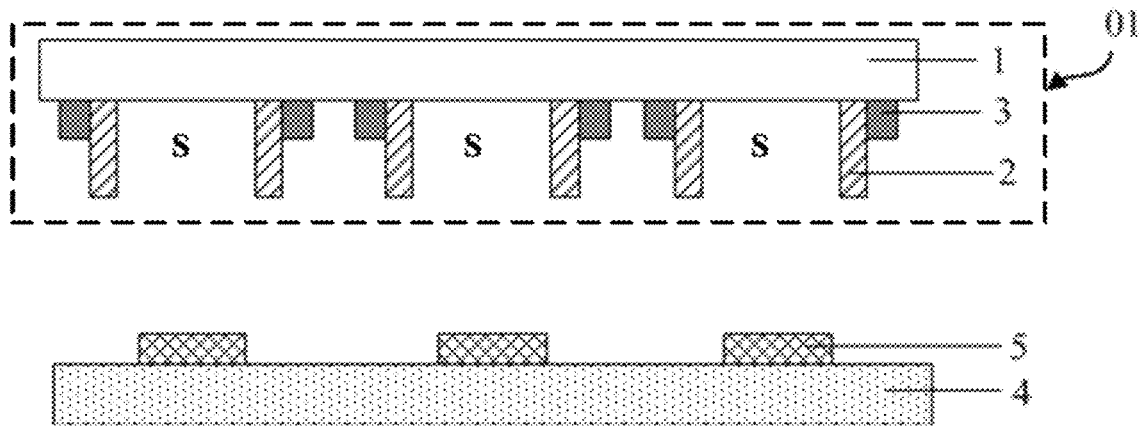
FIG. 18 is a schematic diagram illustrating an alignment between a transfer substrate and a mother substrate in some embodiments according to the present disclosure.

FIG. 18 is a schematic diagram illustrating an alignment between a transfer substrate and a mother substrate in some embodiments according to the present disclosure. Referring to FIG. 18, in some embodiments, a transfer substrate 01 is move to a position above the mother substrate 4. A respective one of the plurality of micro LEDs 5 is aligned to at least partially fit into the central opening S of the ring-shaped frame structure 2.

Figure 19:
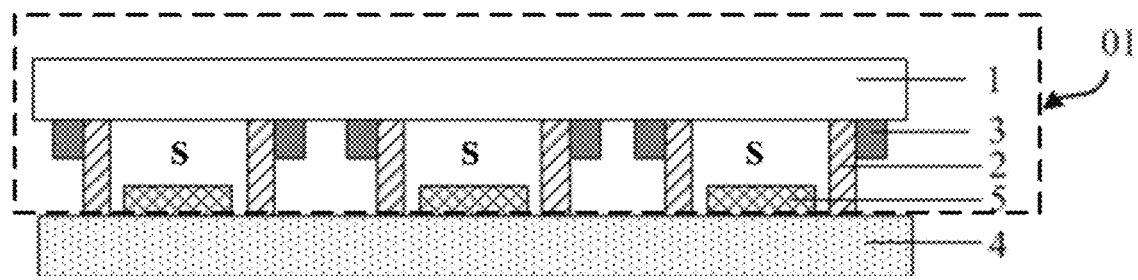
FIG. 19 is a schematic diagram illustrating a transfer substrate is moved toward a mother substrate in some embodiments according to the present disclosure.

FIG. 19 is a schematic diagram illustrating a transfer substrate is moved toward a mother substrate in some embodiments according to the present disclosure. Referring to FIG. 19, in some embodiments, the transfer substrate 01 is moved toward the mother substrate 4.

Figure 20:
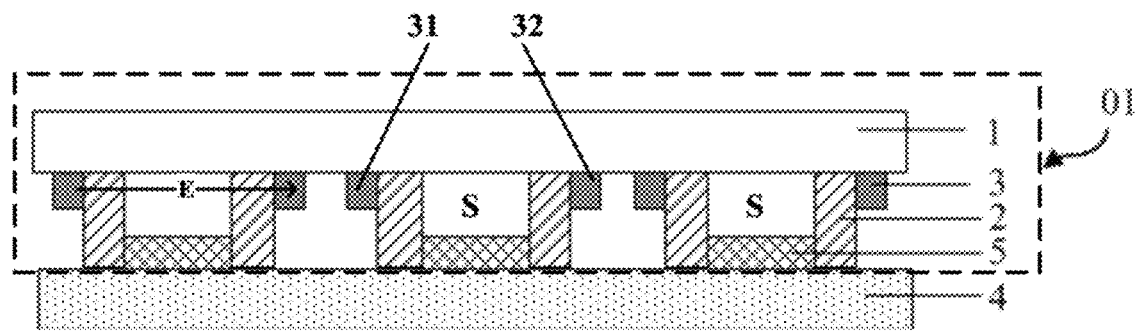
FIG. 20 is a schematic diagram illustrating a ring-shaped frame structure expands toward a center of the central opening upon application of an electric field on the ring-shaped frame structure in some embodiments according to the present disclosure.

FIG. 20 is a schematic diagram illustrating a ring-shaped frame structure expands toward a center of the central opening upon application of an electric field on the ring-shaped frame structure in some embodiments according to the present disclosure. Referring to FIG. 20, electricity is applied to the first controlling sub-electrode 31 and the second controlling sub-electrode 32, so that an electric field E is applied on the ring-shaped frame structure 2. Upon the application of the electric field E, a wall of the ring-shaped frame structure 2 expands to a center of the central opening to secure the respective one of the plurality of micro LEDs 5.

Figure 21:
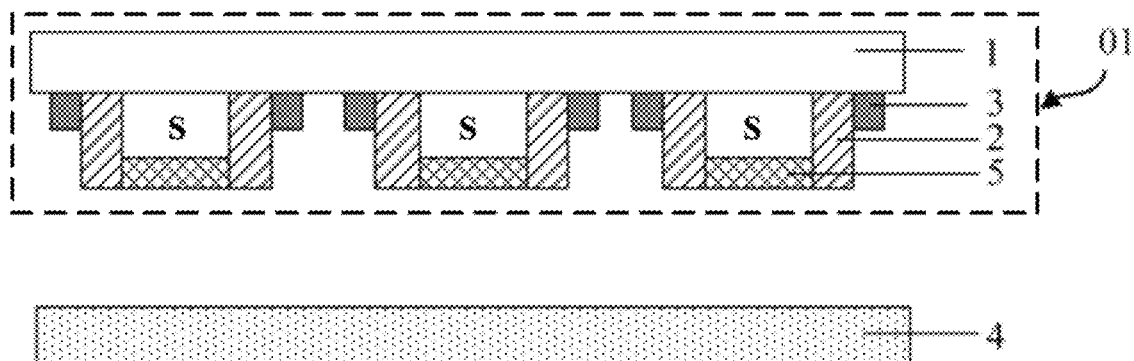
FIG. 21 is a schematic diagram illustrating a transfer substrate is moved away from a mother substrate in some embodiments according to the present disclosure.

FIG. 21 is a schematic diagram illustrating a transfer substrate is moved away from a mother substrate in some embodiments according to the present disclosure. Referring to FIG. 21, in some embodiments, the transfer substrate 01 is moved in a direction away from the mother substrate 4.

Figure 22:
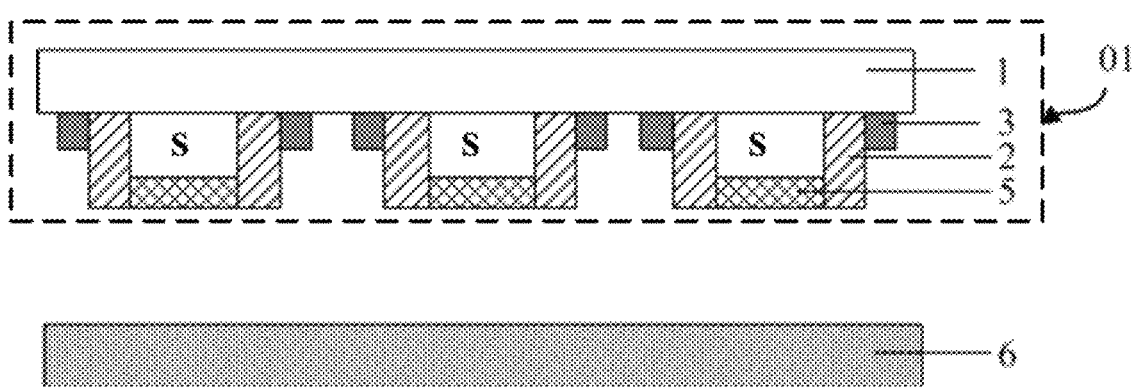
FIG. 22 is a schematic diagram illustrating a transfer substrate is aligned with a target substrate in some embodiments according to the present disclosure.

FIG. 22 is a schematic diagram illustrating a transfer substrate is aligned with a target substrate in some embodiments according to the present disclosure. Referring to FIG. 22, in some embodiments, the transfer substrate 01 is moved to a position above a target substrate 6.

Figure 23:
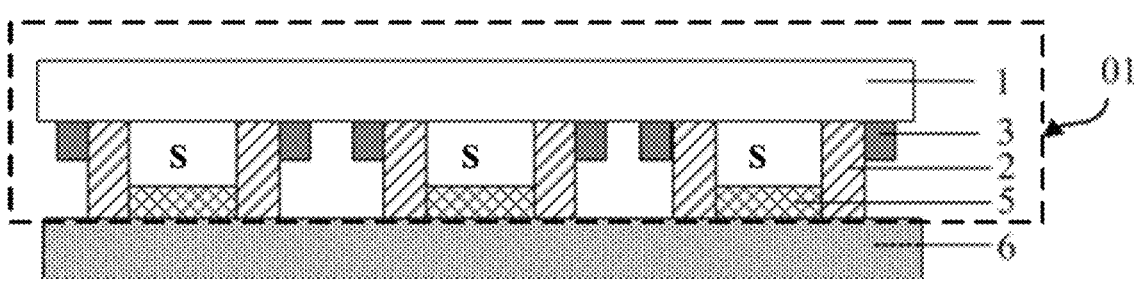
FIG. 23 is a schematic diagram illustrating a transfer substrate is moved toward a target substrate in some embodiment according to the present disclosure.

FIG. 23 is a schematic diagram illustrating a transfer substrate is moved toward a target substrate in some embodiment according to the present disclosure. Referring to FIG. 23, in some embodiments, the transfer substrate 01 is moved toward the target substrate 6.

Figure 24:
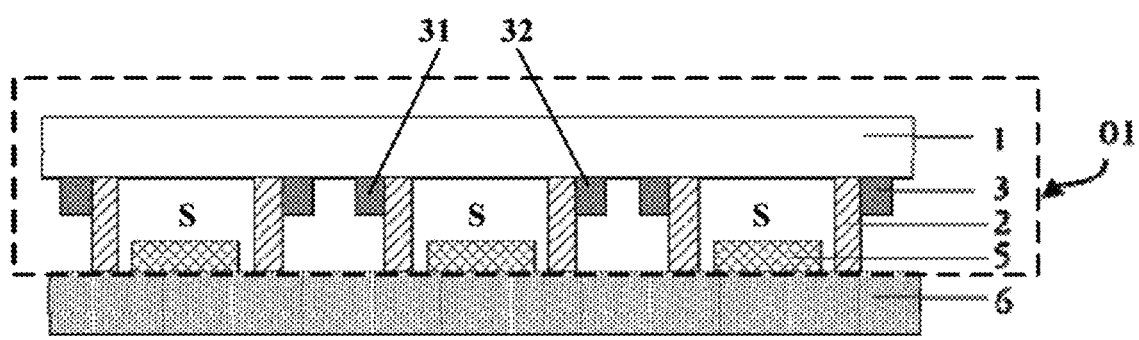
FIG. 24 is a schematic diagram illustrating a ring-shaped frame structure withdraw away from a center of the central opening to move the plurality of micro LEDs from a transfer substrate onto a target substrate in some embodiment according to the present disclosure.

FIG. 24 is a schematic diagram illustrating a ring-shaped frame structure withdraw away from a center of the central opening to move the plurality of micro LEDs from a transfer substrate onto a target substrate in some embodiment according to the present disclosure. Referring to FIG. 24, in some embodiments, electricity is not applied to both the first controlling sub-electrode 31 and the second controlling sub-electrode 32. The electric field E is removed from the ring-shaped frame structure, a wall of the ring-shaped frame structure is withdrawn away from a center of the central opening S, and the respective one of the plurality of micro LEDs 5 is moved from the transfer substrate 01 and disposed on the target substrate 6.

Figure 25:
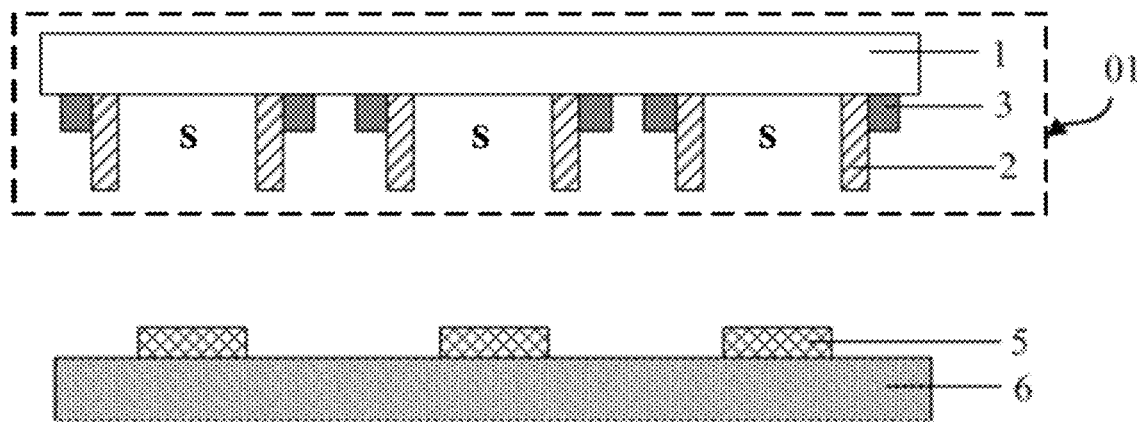
FIG. 25 is a schematic diagram illustrating a transfer substrate is moved away from a target substrate in some embodiment according to the present disclosure.

FIG. 25 is a schematic diagram illustrating a transfer substrate is moved away from a target substrate in some embodiment according to the present disclosure. Referring to FIG. 25, in some embodiments, the transfer substrate 01 is moved in a direction away from the target substrate 6.

In some embodiments, a transfer substrate include a base substrate, an array of a plurality of electroactive actuators. A respective one of the plurality of electroactive actuators includes a ring-shaped frame structure substantially surrounding a central opening. The ring-shaped frame structure is configured to undergo a reversible deformation between a first state and a second state upon a change in an electric field applied on the ring-shaped frame structure. A distance between two positions on an inner wall of the ring-shaped frame structure and across the central opening has a first value in the first state and a second value in the second state. The first value is greater than the second value.

In one example, upon removal of an electric field from the ring-shaped frame structure, an orthographic projection of the central opening on a mother substrate is greater than an orthographic projection of a respective one of the plurality of micro LEDs on the mother substrate. For example, in the process of aligning the transfer substrate with the mother substrate, the respective one of the plurality of micro LEDs can be fit into the central opening. Optionally, a wall of the ring-shaped frame structure doesn't contact with the respective one of the plurality of micro LEDs.

In another example, upon application of an electric filed on the ring-shaped frame structure, the wall of the ring-shaped frame structure expands toward a center of the central openings. Optionally, the orthographic projection of the central opening on the mother substrate has a size equal or smaller than the size of the orthographic projection of the respective one of the plurality of micro LEDs, the ring-shaped frame structure can secure the respective one of the plurality of micro LEDs, and the respective one of the plurality of micro LEDs can be moved from the mother substrate.

In another example, after the transfer substrate is aligned with the target substrate, the electric field is removed from the ring-shaped frame structure, the wall of the ring-shaped frame structure is withdrawn away from a center of the central opening, and the respective one of the plurality of micro LEDs is moved from the transfer substrate and disposed on the target substrate. The process may efficiently and accurately transfer the plurality of micro LEDs from the mother substrate to the target substrate.

In another aspect, the present disclosure also provides a micro LED display substrate fabricated by a method described herein.

In some embodiments, a micro LED display substrate is fabricated by method includes providing a mother substrate including an array of a plurality of micro LEDs; providing a transfer substrate including an array of a plurality of electroactive actuators made of an electroactive material; and transferring the array of the plurality of micro LEDs from the mother substrate onto the transfer substrate.

Optionally, a respective one of the plurality of electroactive actuators includes a ring-shaped frame structure substantially surrounding a central opening, the ring-shaped frame structure made of an electroactive material.

Optionally, the ring-shaped frame structure is configured to undergo a reversible deformation between a first state and a second state upon a change in an electric field applied on the ring-shaped frame structure. Optionally, a distance between two positions on an inner wall of the ring-shaped frame structure and across the central opening has a first value in the first state and a second value in the second state. Optionally, the first value is greater than the second value.

Optionally, the array of the plurality of electroactive actuators has a pattern substantially the same as a pattern of the array of a plurality of micro LEDs.

In some embodiments, the micro LED display substrate is fabricated by method includes maintaining the ring-shaped frame structure in the first state; aligning the transfer substrate and the mother substrate to allow a respective one of the plurality of micro LEDs at least partially fit into the central opening; applying an electric field on the ring-shaped frame structure to maintain the ring-shaped frame structure in the second state, thereby securing the respective one of the plurality of micro LEDs by the ring-shaped frame structure; and removing the plurality of micro LEDs from the mother substrate thereby transferring the array of the plurality of micro LEDs from the mother substrate onto the transfer substrate.

Optionally, maintaining the ring-shaped frame structure in the first state includes applying no electric field to the ring-shaped frame structure.

In some embodiments, the micro LED display substrate is fabricated by method includes providing a target substrate; and transferring the array of the plurality of micro LEDs from the transfer substrate onto a target substrate.

Optionally, transferring the array of the plurality of micro LEDs from the transfer substrate onto the target substrate includes maintaining the ring-shaped frame structure in the second state; aligning the transfer substrate and the target substrate; changing the electric field applied on the ring-shaped frame structure to maintain the ring-shaped frame structure in the first state, thereby releasing the respective one of the plurality of micro LEDs from the ring-shaped frame structure; and releasing the plurality of micro LEDs from the transfer substrate onto the target substrate.

Optionally, maintaining the ring-shaped frame structure in the second state includes applying an electric field on the ring-shaped frame structure to expand a wall of the ring-shaped frame structure toward a center of the central opening and maintain a distance between two positions on an inner wall of the ring-shaped frame structure at the second value.

Optionally, changing the electric field applied on the ring-shaped frame structure to maintain the ring-shaped frame structure in the first state includes removing the electric field on the ring-shaped frame structure to withdraw the wall of the ring-shaped frame structure away from the center of the central opening and maintain the distance between two positions on an inner wall of the ring-shaped frame at the first value In some embodiments, the micro LED display substrate is an array substrate including a plurality of signal lines such as a plurality of gate lines and a plurality of data lines.

In another aspect, the present disclosure also provides a display panel containing the micro LED display substrate described herein. Optionally, the display panel is a liquid crystal display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A transfer substrate for transferring an array of a plurality of micro light emitting diodes (micro LEDs) onto a target substrate, comprising:
    a base substrate; and
    an array of a plurality of electroactive actuators;
    wherein a respective one of the plurality of electroactive actuators comprises a ring-shaped frame structure substantially surrounding a central opening, the ring-shaped frame structure made of an electroactive material;
    the ring-shaped frame structure is configured to undergo a reversible deformation between a first state and a second state upon a change in an electric field applied on the ring-shaped frame structure, a distance between two positions on an inner wall of the ring-shaped frame structure and across the central opening having a first value in the first state and a second value in the second state, the first value being greater than the second value;

a respective one of the plurality of electroactive actuators further comprises a controlling electrode;

the controlling electrode comprises a first controlling sub-electrode on a first side of the ring-shaped frame structure of the respective one of the plurality of electroactive actuators, and a second controlling sub-electrode on a second side of the ring-shaped frame structure of the respective one of the plurality of electroactive actuators;

a same row of the array of the plurality of electroactive actuators shares a same integral first controlling sub-electrode along a row direction of the array of the plurality of electroactive actuators; and the same row of the array of the plurality of electroactive actuators shares a same integral second controlling sub-electrode along the row direction of the array of the plurality of electroactive actuators.

2. The transfer substrate of claim 1, wherein the array of the plurality of electroactive actuators has a pattern substantially the same as a pattern of the array of a plurality of micro LEDs;

the central opening in the first state has a size greater than a size of a respective one of the plurality of micro LEDs, and the respective one of the plurality of micro LEDs being freely removable from the central opening in the first state; and the central opening in the second state has a size equal to or less than the size of the respective one of the plurality of micro LEDs, and the ring-shaped frame structure is configured to secure the respective one of the plurality of micro LEDs therein.

3. The transfer substrate of claim 1, wherein the ring-shaped frame structure has a closed ring shape.

4. The transfer substrate of claim 1, wherein the electroactive material comprises a material selected from a group consisting of zinc oxide, lead magnesium niobate, lead magnesium niobate-lead titanate, lead lanthanum zirconate titanate, and lead barium zirconate titanate.

5. The transfer substrate of claim 1, wherein a height of the ring-shaped frame structure along a direction perpendicular to a main surface of the base substrate is equal to or greater than one half of a height of a respective one of the plurality of micro LEDs to be transferred.

6. The transfer substrate of claim 1, wherein a maximum width of the central opening between two positions on an inner wall of the ring-shaped frame structure is in a range of approximately 1 µm to approximately 100 µm; and a thickness of a wall of the ring-shaped frame structure is in a range of approximately 1 µm to approximately 100 µm.

7. The transfer substrate of claim 1, wherein an electric field is not applied to the ring-shaped frame structure in the first state;

upon application of an electric field on the ring-shaped frame structure, a wall of the ring-shaped frame structure is configured to expand toward a center of the central opening to reduce the distance between two positions on the inner wall of the ring-shaped frame structure from the first value to the second value; and upon removal of the electric field on the ring-shaped frame structure, the wall of the ring-shaped frame structure is configured to withdraw away from the center of the central opening to increase the distance between two positions on an inner wall of the ring-shaped frame structure from the second value to the first value.

8. A transfer substrate for transferring an array of a plurality of micro light emitting diodes (micro LEDs) onto a target substrate, comprising:

a base substrate; and an array of a plurality of electroactive actuators;

wherein a respective one of the plurality of electroactive actuators comprises a ring-shaped frame structure substantially surrounding a central opening, the ring-shaped frame structure made of an electroactive material;

the ring-shaped frame structure is configured to undergo a reversible deformation between a first state and a second state upon a change in an electric field applied on the ring-shaped frame structure, a distance between two positions on an inner wall of the ring-shaped frame structure and across the central opening having a first value in the first state and a second value in the second state, the first value being greater than the second value;

a respective one of the plurality of electroactive actuators further comprises a controlling electrode;

the controlling electrode comprises a first controlling sub-electrode on a first side of the ring-shaped frame structure of the respective one of the plurality of electroactive actuators, and a second controlling sub-electrode on a second side of the ring-shaped frame structure of the respective one of the plurality of electroactive actuators;

the controlling electrode and the ring-shaped frame structure are on a same layer;

the first controlling sub-electrode is on a side of a wall of the ring-shaped frame structure away from a center of the central opening;

the second controlling sub-electrode is on a side of the wall of the ring-shaped frame structure away from the center of the central opening; and the first side is substantially opposite to the second side.

9. The transfer substrate of claim 8, wherein the array of the plurality of electroactive actuators has a pattern substantially the same as a pattern of the array of a plurality of micro LEDs;

the central opening in the first state has a size greater than a size of a respective one of the plurality of micro LEDs, and the respective one of the plurality of micro LEDs being freely removable from the central opening in the first state; and the central opening in the second state has a size equal to or less than the size of the respective one of the plurality of micro LEDs, and the ring-shaped frame structure is configured to secure the respective one of the plurality of micro LEDs therein.

10. The transfer substrate of claim 8, wherein the ring-shaped frame structure has a closed ring shape.

11. The transfer substrate of claim 8, wherein the electroactive material comprises a material selected from a group consisting of zinc oxide, lead magnesium niobate, lead magnesium niobate-lead titanate, lead lanthanum zirconate titanate, and lead barium zirconate titanate.

12. The transfer substrate of claim 8, wherein a height of the ring-shaped frame structure along a direction perpendicular to a main surface of the base substrate is equal to or greater than one half of a height of a respective one of the plurality of micro LEDs to be transferred.

13. The transfer substrate of claim 8, wherein a maximum width of the central opening between two positions on an inner wall of the ring-shaped frame structure is in a range of approximately 1 μm to approximately 100 μm; and a thickness of a wall of the ring-shaped frame structure is in a range of approximately 1 μm to approximately 100 μm.

14. The transfer substrate of claim 8, wherein an electric field is not applied to the ring-shaped frame structure in the first state;

upon application of an electric field on the ring-shaped frame structure, a wall of the ring-shaped frame structure is configured to expand toward a center of the central opening to reduce the distance between two positions on the inner wall of the ring-shaped frame structure from the first value to the second value; and upon removal of the electric field on the ring-shaped frame structure, the wall of the ring-shaped frame structure is configured to withdraw away from the center of the central opening to increase the distance between two positions on an inner wall of the ring-shaped frame structure from the second value to the first value.

15. A transfer substrate for transferring an array of a plurality of micro light emitting diodes (micro LEDs) onto a target substrate, comprising:

a base substrate; and an array of a plurality of electroactive actuators;

wherein a respective one of the plurality of electroactive actuators comprises a ring-shaped frame structure substantially surrounding a central opening, the ring-shaped frame structure made of an electroactive material;

the ring-shaped frame structure is configured to undergo a reversible deformation between a first state and a second state upon a change in an electric field applied on the ring-shaped frame structure, a distance between two positions on an inner wall of the ring-shaped frame structure and across the central opening having a first value in the first state and a second value in the second state, the first value being greater than the second value;

a respective one of the plurality of electroactive actuators further comprises a controlling electrode;

the controlling electrode comprises a first controlling sub-electrode on a first side of the ring-shaped frame structure of the respective one of the plurality of electroactive actuators, and a second controlling sub-electrode on a second side of the ring-shaped frame structure of the respective one of the plurality of electroactive actuators;

the ring-shaped frame structure is on a side of the controlling electrode away from the base substrate; and an orthographic projection of the ring-shaped frame structure on the base substrate at least partially overlaps with an orthographic projection of the controlling electrode on the base substrate.

16. The transfer substrate of claim 15, wherein the array of the plurality of electroactive actuators has a pattern substantially the same as a pattern of the array of a plurality of micro LEDs;

the central opening in the first state has a size greater than a size of a respective one of the plurality of micro LEDs, and the respective one of the plurality of micro LEDs being freely removable from the central opening in the first state; and the central opening in the second state has a size equal to or less than the size of the respective one of the plurality of micro LEDs, and the ring-shaped frame structure is configured to secure the respective one of the plurality of micro LEDs therein.

17. The transfer substrate of claim 15, wherein the ring-shaped frame structure has a closed ring shape.

18. The transfer substrate of claim 15, wherein the electroactive material comprises a material selected from a group consisting of zinc oxide, lead magnesium niobate, lead magnesium niobate-lead titanate, lead lanthanum zirconate titanate, and lead barium zirconate titanate.

19. The transfer substrate of claim 15, wherein a height of the ring-shaped frame structure along a direction perpendicular to a main surface of the base substrate is equal to or greater than one half of a height of a respective one of the plurality of micro LEDs to be transferred.

20. The transfer substrate of claim 15, wherein an electric field is not applied to the ring-shaped frame structure in the first state;

upon application of an electric field on the ring-shaped frame structure, a wall of the ring-shaped frame structure is configured to expand toward a center of the central opening to reduce the distance between two positions on the inner wall of the ring-shaped frame structure from the first value to the second value; and upon removal of the electric field on the ring-shaped frame structure, the wall of the ring-shaped frame structure is configured to withdraw away from the center of the central opening to increase the distance between two positions on an inner wall of the ring-shaped frame structure from the second value to the first value.

* * * * *